United States Patent
Mahalingam et al.

(10) Patent No.: US 12,136,625 B2
(45) Date of Patent: Nov. 5, 2024

(54) LOW COST, HIGH PERFORMANCE ANALOG METAL OXIDE SEMICONDUCTOR TRANSISTOR

(71) Applicant: Texas Instruments Incorporated, Dallas, TX (US)

(72) Inventors: Pushpa Mahalingam, Richardson, TX (US); Alexei Sadovnikov, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 107 days.

(21) Appl. No.: 17/512,908

(22) Filed: Oct. 28, 2021

(65) Prior Publication Data

US 2023/0134131 A1    May 4, 2023

(51) Int. Cl.
| | |
|---|---|
| H01L 27/092 | (2006.01) |
| H01L 21/265 | (2006.01) |
| H01L 21/266 | (2006.01) |
| H01L 21/8238 | (2006.01) |

(52) U.S. Cl.
CPC .. H01L 27/0928 (2013.01); H01L 21/823814 (2013.01); H01L 21/823857 (2013.01); H01L 21/823892 (2013.01); H01L 21/2652 (2013.01); H01L 21/266 (2013.01)

(58) Field of Classification Search
None
See application file for complete search history.

(56) References Cited

U.S. PATENT DOCUMENTS

| | | | |
|---|---|---|---|
| 6,365,932 B1 | 4/2002 | Kouno et al. | |
| 10,014,206 B1 | 7/2018 | Chuang | |
| 2018/0174887 A1* | 6/2018 | Chuang | ............... H01L 29/1095 |

FOREIGN PATENT DOCUMENTS

EP    3098857 A1 *  11/2016   ......... H01L 29/0634

* cited by examiner

*Primary Examiner* — Alexander G Ghyka
(74) *Attorney, Agent, or Firm* — Yudong Kim; Frank D. Cimino

(57) ABSTRACT

A microelectronic device including an analog MOS transistor. The analog transistor has a body well having a first conductivity type in a semiconductor material of a substrate of the microelectronic device. The body well extends deeper in the substrate than a field relief dielectric layer at the top surface of the semiconductor material. The analog transistor has a drain well and a source well having a second, opposite, conductivity type in the semiconductor material, both contacting the body well. The drain well and the source well extend deeper in the substrate than the field relief dielectric layer. The analog transistor has a gate on a gate dielectric layer over the body well. The drain well and the source well extend partway under the gate at the top surface of the semiconductor material.

21 Claims, 21 Drawing Sheets

LOW COST, HIGH PERFORMANCE ANALOG METAL OXIDE SEMICONDUCTOR TRANSISTOR

FIELD

This disclosure relates to the field of microelectronic devices. More particularly, but not exclusively, this disclosure relates to metal oxide semiconductor transistors in microelectronic devices.

BACKGROUND

Microelectronic devices frequently have two categories of metal oxide semiconductor (MOS) transistors. The first category includes n-channel metal oxide semiconductor (NMOS) transistors and p-channel metal oxide semiconductor (PMOS) transistors, which operate at potentials less than 3.5 volts. The first category of MOS transistors may be used in logic circuits. The second category includes NMOS and PMOS transistors that operate at potentials of 5 to 12 volts. The MOS transistors in the second category may be used in analog circuits, in which low noise, precise thresholds, and long term stability are desired.

SUMMARY

The present disclosure introduces a microelectronic device including an analog metal oxide semiconductor (MOS) transistor, referred to herein as the analog transistor. The microelectronic device is formed on a substrate having a semiconductor material. The analog transistor has a body well having a first conductivity type in the semiconductor material. The body well extends deeper in the substrate than a field relief dielectric layer at the top surface of the semiconductor material. The analog transistor has a drain well having a second, opposite, conductivity type in the semiconductor material, contacting the body well. The analog transistor also has a source well having the second conductivity type in the semiconductor material, contacting the body well opposite from the drain well. The drain well and the source well extend deeper in the substrate than the field relief dielectric layer. The analog transistor has a gate on a gate dielectric layer over the body well. The drain well and the source well extend partway under the gate at the top surface of the semiconductor material.

DETAILED DESCRIPTION

Figure 1A:
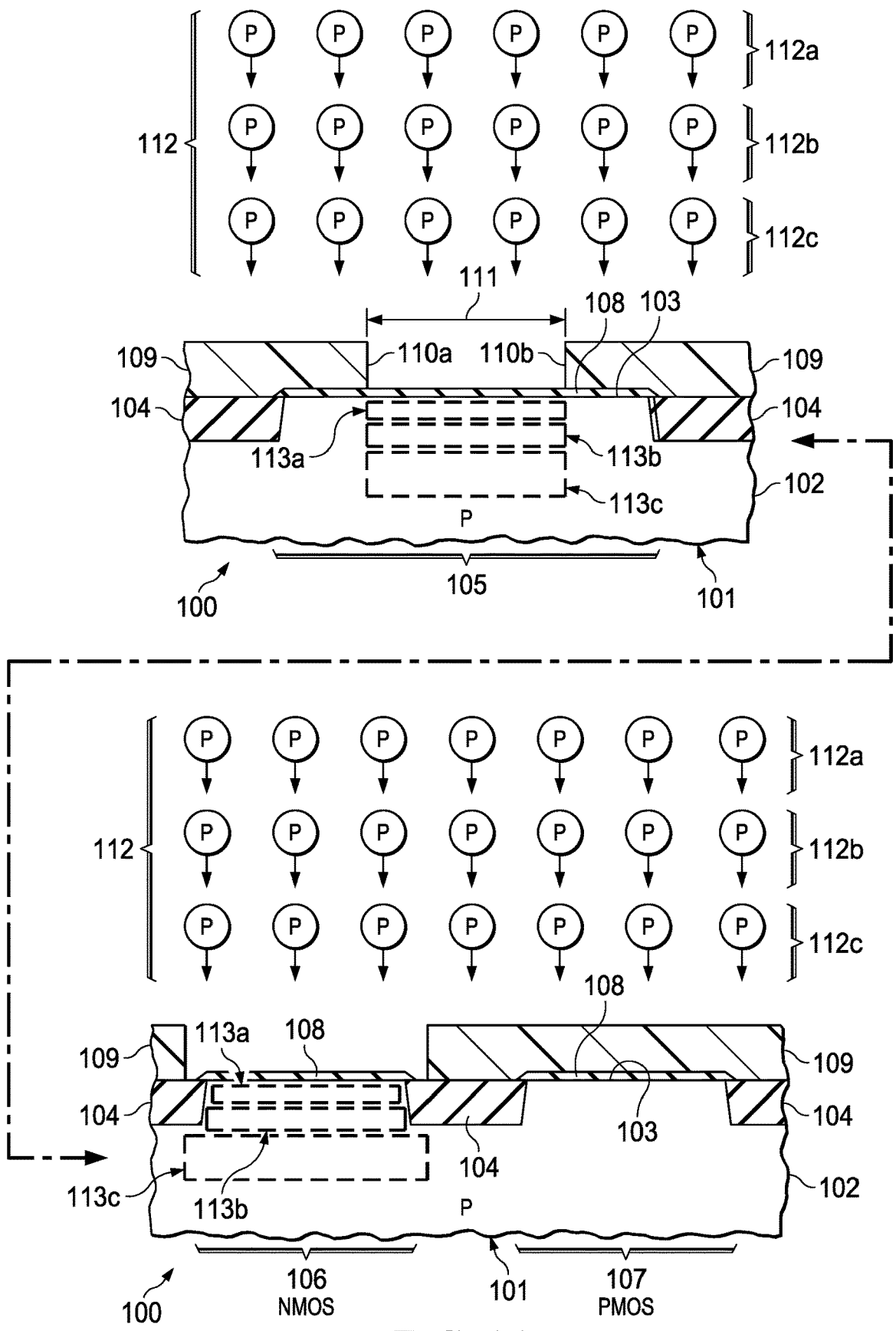
FIG. 1A through FIG. 1L are cross sections of an example microelectronic device that includes an analog transistor, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A microelectronic device is formed on a substrate that includes a semiconductor material. The microelectronic device has a field relief dielectric layer at the top surface of the semiconductor material. The microelectronic device includes an analog metal oxide semiconductor (MOS) transistor. The analog transistor has a body well having a first conductivity type in the semiconductor material. The body well extends deeper in the semiconductor material than the field relief dielectric layer. The analog transistor has a drain well having a second, opposite, conductivity type in the semiconductor material, contacting the body well. The analog transistor also has a source well having the second conductivity type in the semiconductor material, contacting the body well opposite from the drain well. The drain well and the source well extend deeper in the substrate than the field relief dielectric layer. The analog transistor has a gate on a gate dielectric layer over the body well. The drain well and the source well extend partway under the gate at the top surface of the substrate.

The microelectronic device may include an n-channel metal oxide semiconductor (NMOS) transistor and a p-channel metal oxide semiconductor (PMOS) transistor that operate at lower drain-source potentials than the analog transistor. The NMOS transistor and the PMOS transistor may be located in a p-type well and an n-type well, respectively, that have similar dopant distributions to the body well and the source and drain wells of the analog transistor, as a result of being formed concurrently.

It is noted that terms such as top, bottom, over, above, under, and below may be used in this disclosure. These terms should not be construed as limiting the position or orientation of a structure or element, but should be used to provide spatial relationship between structures or elements. The term "outward" refers to directions away from a geometric center of a device or area and designated parts thereof. For the purposes of this disclosure, the terms "lateral" and "laterally" refer to a direction parallel to a plane of the top surface of the substrate. The terms "vertical" and "vertically" are understood to refer to a direction perpendicular to the plane of the top surface of the substrate.

The term "p-type dopants" refers to boron, gallium, and indium, as they provide p-type conductivity in silicon semiconductor material. The term "n-type dopants" refers to phosphorus, arsenic, and antimony, as they provide n-type conductivity in silicon semiconductor material. When two semiconductor regions are disclosed as having similar distributions of first (or second) conductivity type dopants, the distributions are understood to be equal within tolerances normally encountered in fabrication process, such as ion implantation and activation processes, used to form the two semiconductor regions; thus the distributions may be equal within 5 percent. The distributions may be estimated from a cross section sample of the semiconductor regions by measuring impedances of the semiconductor regions using scanning capacitance microscopy (SCM) or scanning microwave impedance microscopy (SMIM). Estimates of the distributions may differ by an amount within tolerances encountered in the SCM and SMIM methods, which may be less than 10 percent.

FIG. 1A through FIG. 1L are cross sections of an example microelectronic device that includes an analog transistor, depicted in stages of an example method of formation. Referring to FIG. 1A, the microelectronic device 100 is formed in and on a substrate 101. The microelectronic device 100 may be manifested as an integrated circuit, a discrete semiconductor device, a microelectrical mechanical system (MEMS) device, an electro-optical device, or a microfluidic device, by way of example. The substrate 101 may be, for example, part of a bulk semiconductor wafer, part of a semiconductor wafer with an epitaxial layer, part of a silicon-on-insulator (SOI) wafer, or other structure suitable for forming the microelectronic device 100. The substrate 101 includes a semiconductor material 102, such as silicon. Other semiconductor materials are within the scope of this example. In this example, the semiconductor material 102 may be p-type, as indicated in FIG. 1A. The semiconductor material 102 has a top surface 103.

A field relief dielectric layer 104 is formed on the semiconductor material 102 at the top surface 103. The field relief dielectric layer 104 may be formed by a shallow trench isolation (STI) process and have an STI structure in which the field relief dielectric layer 104 is in a trench in the semiconductor material 102, as depicted in FIG. 1A. Alternatively, the field relief dielectric layer 104 may be formed by a local oxidation of silicon (LOCOS) process and have a LOCOS structure, in which the field relief dielectric layer 104 would have tapered edges, and extend partway into the semiconductor material 102 and extend partway above the semiconductor material 102. The field relief dielectric layer 104 laterally surrounds areas of the semiconductor material 102 for the analog transistor 105, an NMOS transistor 106 and a PMOS transistor 107. In this example, the analog transistor 105 is described as an n-channel analog transistor.

A first protective oxide layer 108 may be formed at the top surface 103 of the semiconductor material 102 exposed by the field relief dielectric layer 104. The first protective oxide layer 108 may include primarily silicon dioxide, and may be formed by a thermal oxidation process to a thickness of 5 nanometers to 20 nanometers, by way of example. The first protective oxide layer 108 may protect the semiconductor material 102 from damage and contamination during subsequent fabrication steps.

A first well implant mask 109 is formed over the substrate 101, exposing areas in the analog transistor 105 and the NMOS transistor 106, for subsequently formed p-type wells, shown in FIG. 1C. The first well implant mask 109 may include photoresist, with anti-reflection materials such as bottom anti-reflection coating (BARC) under the photoresist. The first well implant mask 109 may be formed by a photolithographic process to pattern the photoresist, followed by an etch process to remove the BARC where exposed by the patterned photoresist. The first well implant mask 109 may have a thickness of 1.5 microns to 2.5 microns. The first well implant mask 109 has a source-side edge 110a and a drain-side edge 110b on opposite sides of the exposed area in the analog transistor 105, separated by a first width 111. Use of the anti-reflection materials may enable forming the first well implant mask 109 with the first width 111 that is 20 percent to 30 percent of the thickness of the first well implant mask 109, advantageously providing a shorter channel length, and thus a higher on-state current, for the analog transistor 105 compared to using a well implant mask formed without anti-reflection materials. In this example, the first width 111 may be 0.4 microns to 0.5 microns.

First p-type dopants 112 are implanted into the semiconductor material 102 where exposed by the first well implant mask 109. The first p-type dopants 112 may be implanted in multiple doses at different energies, to distribute the first p-type dopants 112 vertically in the semiconductor material 102. By way of example, the first p-type dopants 112 may be implanted in three doses. A first dose 112a of $3.0 \times 10^{12}$ ions/cm$^2$ to $1.0 \times 10^{13}$ ions/cm$^2$ of indium or gallium ions may be implanted at an energy of 50 kiloelectron volts (keV) to 125 keV to form a first implanted region 113a in the semiconductor material 102. A second dose 112b of $5.0 \times 10^{12}$ ions/cm$^2$ to $1.2 \times 10^{13}$ ions/cm$^2$ of boron ions may be implanted at an energy of 100 keV to 125 keV to form a second implanted region 113b. A third dose 112c of $1.5 \times 10^{13}$ ions/cm$^2$ to $3.0 \times 10^{13}$ ions/cm$^2$ boron ion may be implanted at an energy of 135 keV to 200 keV to form a third implanted region 113c. Other doses for the first p-type dopants 112 are within the scope of this example. A portion of the first p-type dopants 112 extends in the semiconductor material 102 deeper than the field relief dielectric layer 104.

The first well implant mask 109 is subsequently removed. Organic material in the first well implant mask 109, such as photoresist and BARC, may be removed by an asher process, followed by a wet clean process using an aqueous mixture of hydrogen peroxide and sulfuric acid. Other methods for removing the first well implant mask 109 are within the scope of this example.

Figure 1B:
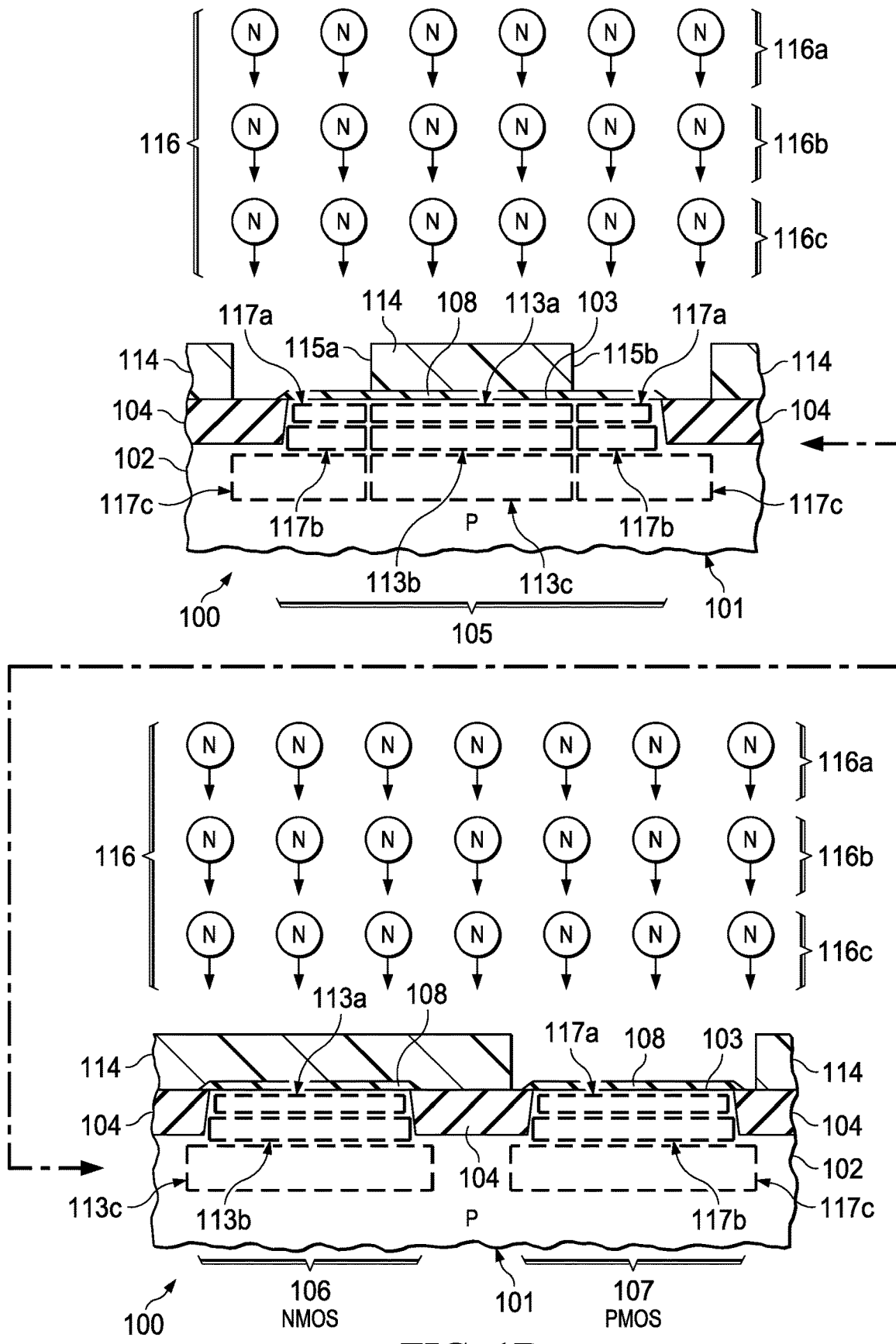

Referring to FIG. 1B, a second well implant mask 114 is formed over the substrate 101, exposing areas in the analog transistor 105 and the PMOS transistor 107, for subsequently formed n-type wells, shown in FIG. 1C. The second well implant mask 114 may have a similar composition and structure to the first well implant mask 109, and may be formed by a similar process.

The second well implant mask 114 has a source-side edge 115a of an exposed area for a subsequently-formed source well 121 of the analog transistor 105, shown in FIG. 1C. The source-side edge 115a of the second well implant mask 114 may be coincident with the source-side edge 110a of the first well implant mask 109 of FIG. 1A, within alignment tolerances of photolithographic processes used to form the microelectronic device 100. For example, the source-side edge 115a of the second well implant mask 114 may be coincident with the source-side edge 110a of the first well implant mask 109 within 0.10 microns.

The second well implant mask 114 has a drain-side edge 115b of an exposed area for a subsequently-formed drain well 122 of the analog transistor 105, shown in FIG. 1C. In this example, the drain-side edge 115b of the second well implant mask 114 may be coincident with the drain-side edge 110b of the first well implant mask 109 of FIG. 1A, within the alignment tolerances.

First n-type dopants 116 are implanted into the semiconductor material 102 where exposed by the second well implant mask 114. The first n-type dopants 116 may be implanted in multiple doses at different energies, to distribute the first n-type dopants 116 vertically in the semiconductor material 102. By way of example, the first n-type dopants 116 may be implanted in three doses. A first dose 116a of $5.0 \times 10^{11}$ ions/cm$^2$ to $1.0 \times 10^{12}$ ions/cm$^2$ of arsenic or antimony ions may be implanted at an energy of 25 keV to 50 keV to form a first implanted region 117a in the semiconductor material 102. A second dose 116b of $3.0 \times 10^{12}$ ions/cm$^2$ to $6.0 \times 10^{13}$ ions/cm$^2$ of phosphorus ions may be implanted at an energy of 200 keV to 300 keV to form a second implanted region 117b. A third dose 116c of $1.5 \times 10^{13}$ ions/cm$^2$ to $4.0 \times 10^{13}$ ions/cm$^2$ phosphorus ion may be implanted at an energy of 300 keV to 500 keV to form a third implanted region 117c. Other doses for the first p-type dopants 116 are within the scope of this example. A portion of the first p-type dopants 116 extends in the semiconductor material 102 deeper than the field relief dielectric layer 104.

The second well implant mask 114 is subsequently removed. The second well implant mask 114 may be removed by a process similar to the process used to remove the first well implant mask 109.

In an alternate version of this example, the first n-type dopants 116 may be implanted after the first p-type dopants 112 of FIG. 1A. In either case, the source-side edge 115a of the second well implant mask 114 may be coincident with the source-side edge 110a of the first well implant mask 109, and the drain-side edge 115b of the second well implant mask 114 may be coincident with the drain-side edge 110b of the first well implant mask 109, within the alignment tolerances.

The first protective oxide layer 108 may be removed after the first n-type dopants 116 and the first p-type dopants 112 are implanted. The first protective oxide layer 108 may be removed by a timed etch process using an aqueous buffered solution of hydrofluoric acid.

Figure 1C:
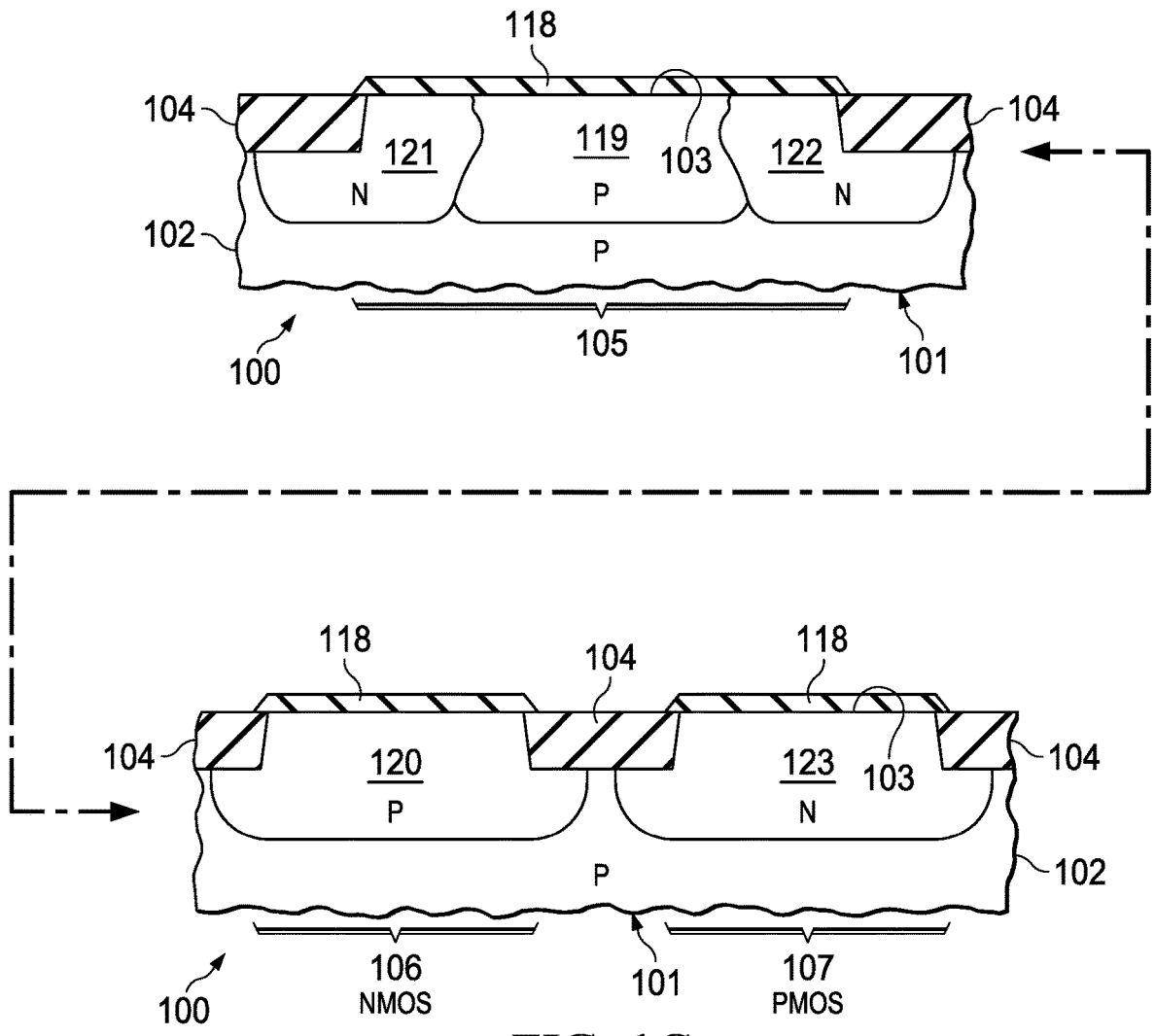

Referring to FIG. 1C, a thick gate dielectric layer 118 is formed on the semiconductor material 102 where exposed at the top surface 103, including in the areas for the analog transistor 105, the NMOS transistor 106, and the PMOS transistor 107. The thick gate dielectric layer 118 may include primarily silicon dioxide, and may be formed by a thermal oxidation process, such as an in-situ steam generation (ISSG) process in a rapid thermal processor, or a dry oxygen thermal oxidation process in a furnace. The thick gate dielectric layer 118 may be nitridated by exposure to nitrogen radicals in a downstream plasma tool. The thick gate dielectric layer 118 may also include one or more high-k dielectric materials, such as hafnium oxide, zirconium oxide, or tantalum oxide. The thick gate dielectric layer 118 has a thickness appropriate for use in the analog transistor 105. For a version of the analog transistor 105 that is operated at 5 volts, the thick gate dielectric layer 118 may have a thickness of 10 nanometers to 15 nanometers, depending on a composition of the thick gate dielectric layer 118.

The process of forming the thick gate dielectric layer 118 heats the semiconductor material 102 sufficiently to activate at least a portion of the implanted p-type dopants 112 of FIG. 1A and the implanted n-type dopants 116 of FIG. 1B. The implanted p-type dopants 112 in the first implanted region 113a, the second implanted region 113b, and the third implanted region 113c form a body well 119 of the analog transistor 105 and a p-type well 120 under the NMOS transistor 106. The body well 119 and the p-type well 120 are p-type, and have similar distributions of the implanted p-type dopants 112. The implanted n-type dopants 116 in the first implanted region 117a, the second implanted region 117b, and the third implanted region 117c form a source well 121 and a drain well 122 of the analog transistor 105, and an n-type well 123 under the PMOS transistor 107. The source well 121, the drain well 122, and the n-type well 123 are n-type, and have similar distributions of the implanted n-type dopants 116. The body well 119, the p-type well 120, the source well 121, the drain well 122, and the n-type well 123 extend deeper in the semiconductor material 102 than the field relief dielectric layer 104. The body well 119 does not extend completely under the source well 121 or the drain well 122, which may advantageously reduce leakage current and junction capacitance in the analog transistor 105, during operation of the microelectronic device 100.

Figure 1D:
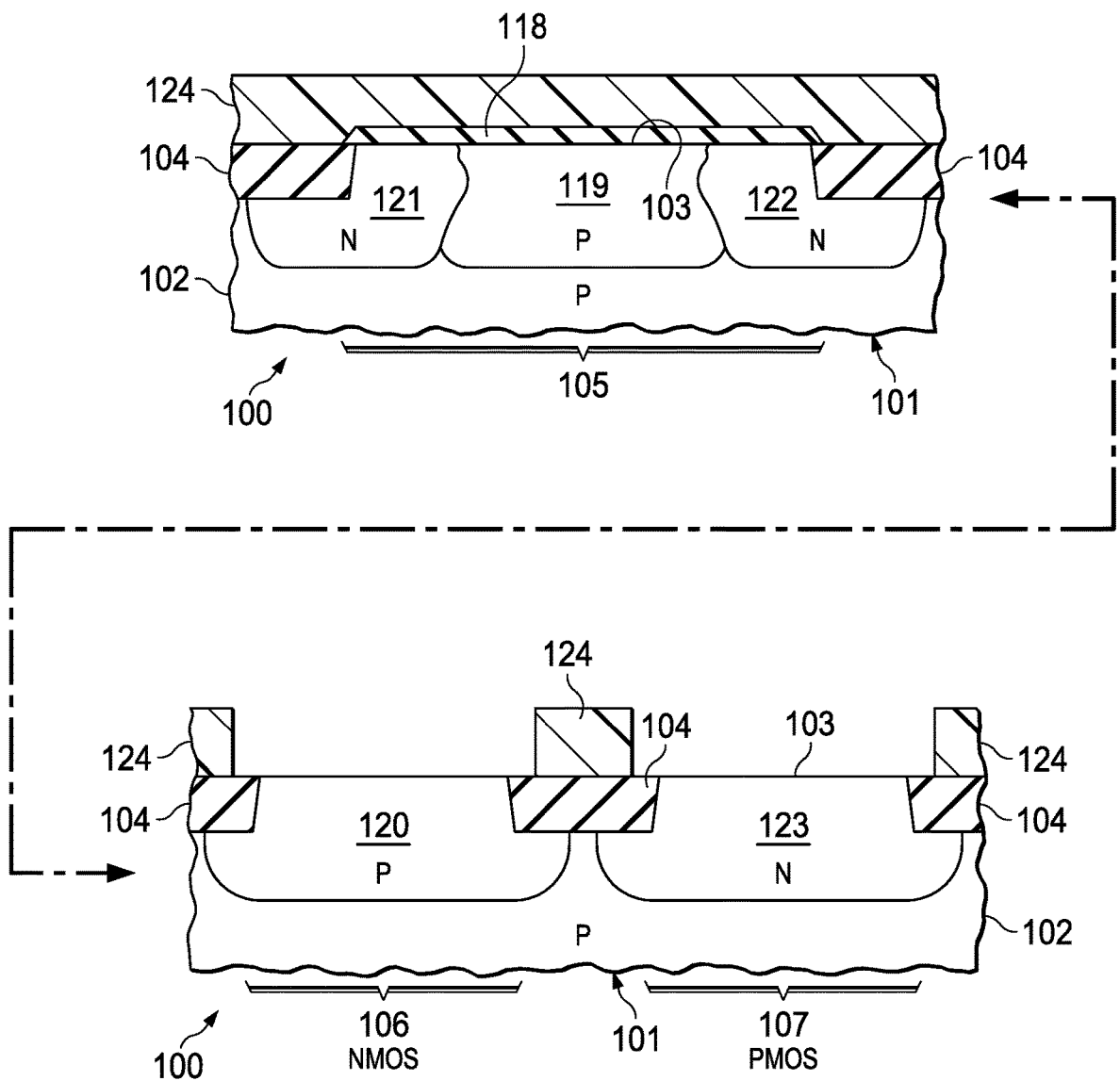

Referring to FIG. 1D, an etch mask 124 is formed over the substrate 101, covering the area for the analog transistor 105, and exposing the areas for the NMOS transistor 106 and the PMOS transistor 107. The etch mask 124 may include photoresist, and may be formed by a photolithographic process.

The thick gate dielectric layer 118 is removed where exposed by the etch mask 124. The thick gate dielectric layer 118 may be removed by a timed etch process using an aqueous buffered solution of hydrofluoric acid.

After the thick gate dielectric layer 118 is removed, the etch mask 124 is removed. The etch mask 124 may be removed by a wet etch process using an aqueous mixture of ozone and sulfuric acid, followed by a wet clean process using an aqueous mixture of ammonium hydroxide and hydrogen peroxide. Other methods of removing the etch mask 124 which do not form a significant thickness of oxide on the top surface 103 are within the scope of this example.

Figure 1E:
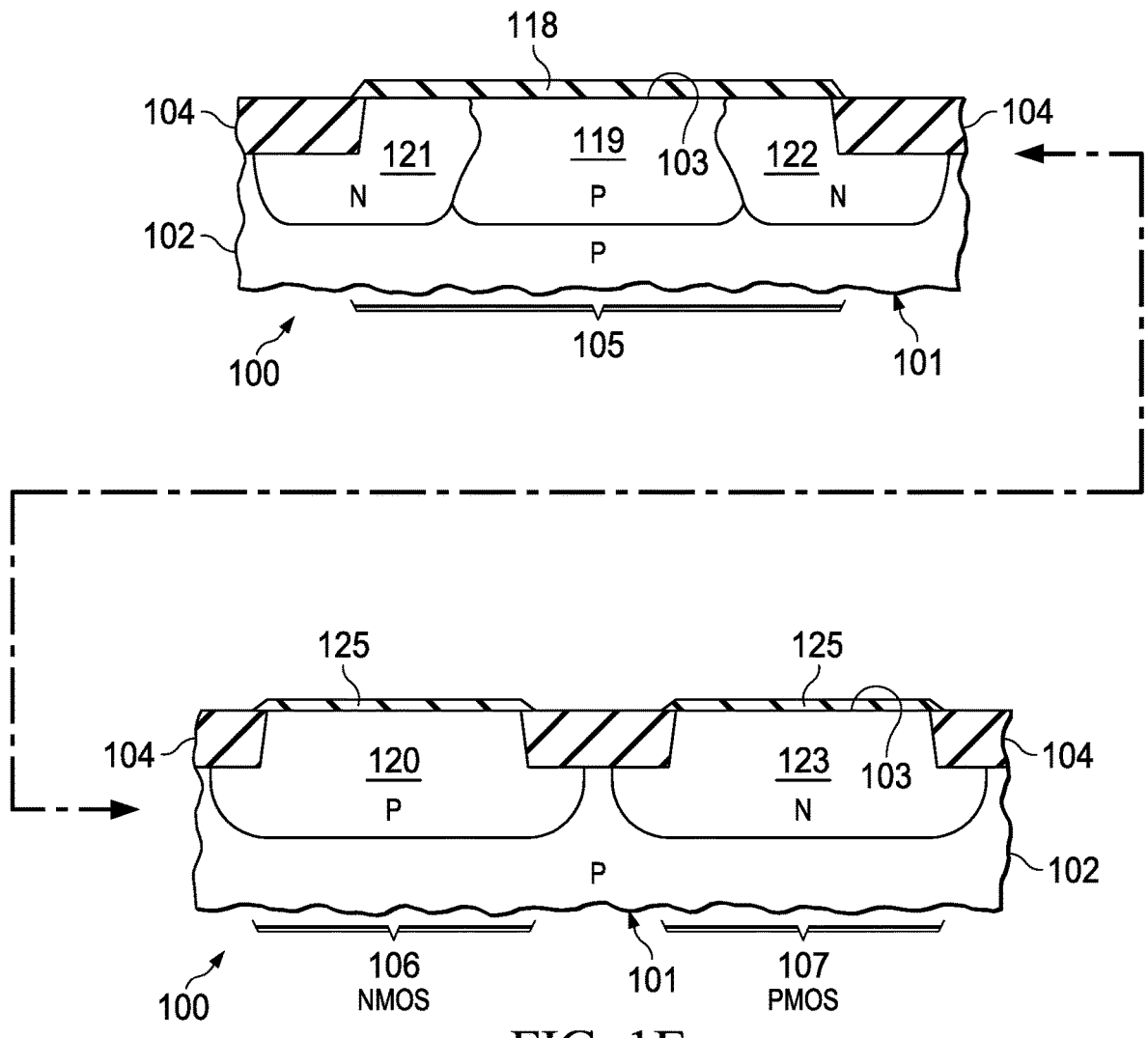

Referring to FIG. 1E, a thin gate dielectric layer 125 is formed on the top surface 103 of the semiconductor material 102 in the areas for the NMOS transistor 106 and the PMOS transistor 107. The thin gate dielectric layer 125 may include primarily silicon dioxide, and may be formed by a thermal oxidation process, such as an ISSG process in a rapid thermal processor, or a dry oxygen thermal oxidation process in a furnace. The thin gate dielectric layer 125 may be nitridated after the thermal oxidation process. The thin gate dielectric layer 125 may also include one or more high-k dielectric materials. The thin gate dielectric layer 125 has a thickness appropriate for use in the NMOS transistor 106 and the PMOS transistor 107. For a version of the NMOS transistor 106 and the PMOS transistor 107 that is operated at 1.8 volts, the thin gate dielectric layer 125 may have a thickness of 1.7 nanometers to 2.0 nanometers, depending on a composition of the thin gate dielectric layer 125. The process of forming the thin gate dielectric layer 125 heats the semiconductor material 102, which may activate an additional portion of the p-type dopants in the body well 119 and the p-type well 120, and may activate an additional portion of the n-type dopants in the source well 121, the drain well 122, and the n-type well 123.

In an alternate version of this example, the semiconductor material 102 may be heated by an anneal process in a rapid thermal processor to activate the p-type dopants in the body well 119 and the p-type well 120, and activate the n-type dopants in the source well 121, the drain well 122, and the n-type well 123.

Figure 1F:
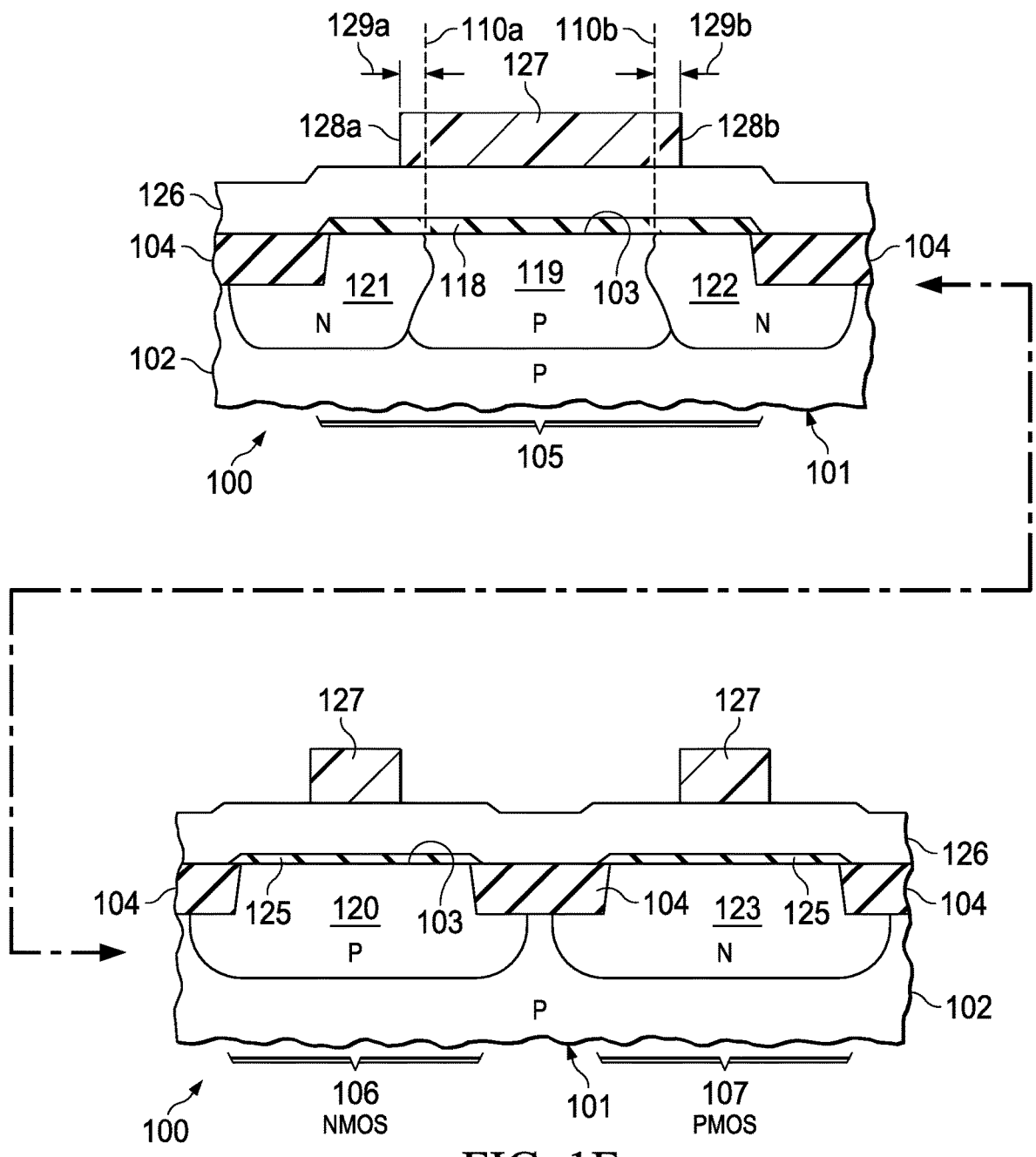

Referring to FIG. 1F, a gate material layer 126 is formed over the microelectronic device 100, contacting the thick gate dielectric layer 118 and the thin gate dielectric layer 125. The gate material layer 126 may include polycrystalline silicon, commonly referred to as polysilicon, and may have a thickness of 250 nanometers to 500 nanometers, by way of example. The gate material layer 126 may optionally include dopants. The gate material layer 126 may be formed by plasma decomposition of silane, for example.

A gate mask 127 is formed over the gate material layer 126, covering areas for subsequently-formed gates of the analog transistor 105, the NMOS transistor 106, and the PMOS transistor 107. The gate mask 127 may include photoresist, patterned by a photolithographic process. The gate mask 127 may include anti-reflection material such as BARC, to enhance resolution of the photolithographic process and provide desired control of lateral dimensions of the gate mask 127. The gate mask 127 may include hard mask material such as silicon dioxide, silicon nitride, or amorphous carbon, to provide durability in a subsequent gate etch process.

The gate mask 127 has a source-side edge 128a over the source well 121. The gate mask 127 extends past the source-side edge 110a of the first well implant mask 109 of FIG. 1A, shown in FIG. 1F for comparison to the source-side edge 128a, so that a subsequently-formed gate electrode 130, shown in FIG. 1G, of the analog transistor 105 partially overlaps the source well 121. In this example, the source-side edge 128a of the gate mask 127 may be separated from the source-side edge 110a of the first well implant mask 109 by a source-side overlap 129a of 0.10 microns to 0.18 microns. Having the source-side overlap 129a at 0.12 microns to 0.18 microns may advantageously balance an on-state current and an area of the analog transistor 105 with a noise level and threshold precision of the analog transistor 105. Threshold precision is sometimes referred to as threshold mismatch, in recognition of the observation that improving threshold precision correspondingly reduces variations, or mismatch, of threshold in other instances of the analog transistor 105 within the microelectronic device 100. Increasing the source-side overlap 129a above 0.18 microns may increase a channel length, undesirably reducing the on-state current, and undesirably increasing the area, while not improving the noise level and threshold precision. Reducing the source-side overlap 129a below 0.12 microns may produce a region having an uncontrolled resistance between the source well 121 and a channel of the analog transistor 105, undesirably increasing the noise level and degrading the threshold precision, while not improving the on-state current.

The gate mask 127 has a drain-side edge 128b over the drain well 122. The gate mask 127 extends past the drain-side edge 110b of the first well implant mask 109 of FIG. 1A, shown in FIG. 1F for comparison to the drain-side edge 128b, so that the subsequently-formed gate electrode 130 partially overlaps the drain well 122. In this example, the drain-side edge 128b of the gate mask 127 may be separated from the drain-side edge 110b of the first well implant mask 109 by a drain-side overlap 129b of 0.12 microns to 0.18 microns. Having the drain-side overlap 129b at 0.12 microns to 0.18 microns may advantageously balance the on-state current and the area with the noise level and threshold precision, as disclosed in reference to the source-side overlap 129a.

Figure 1G:
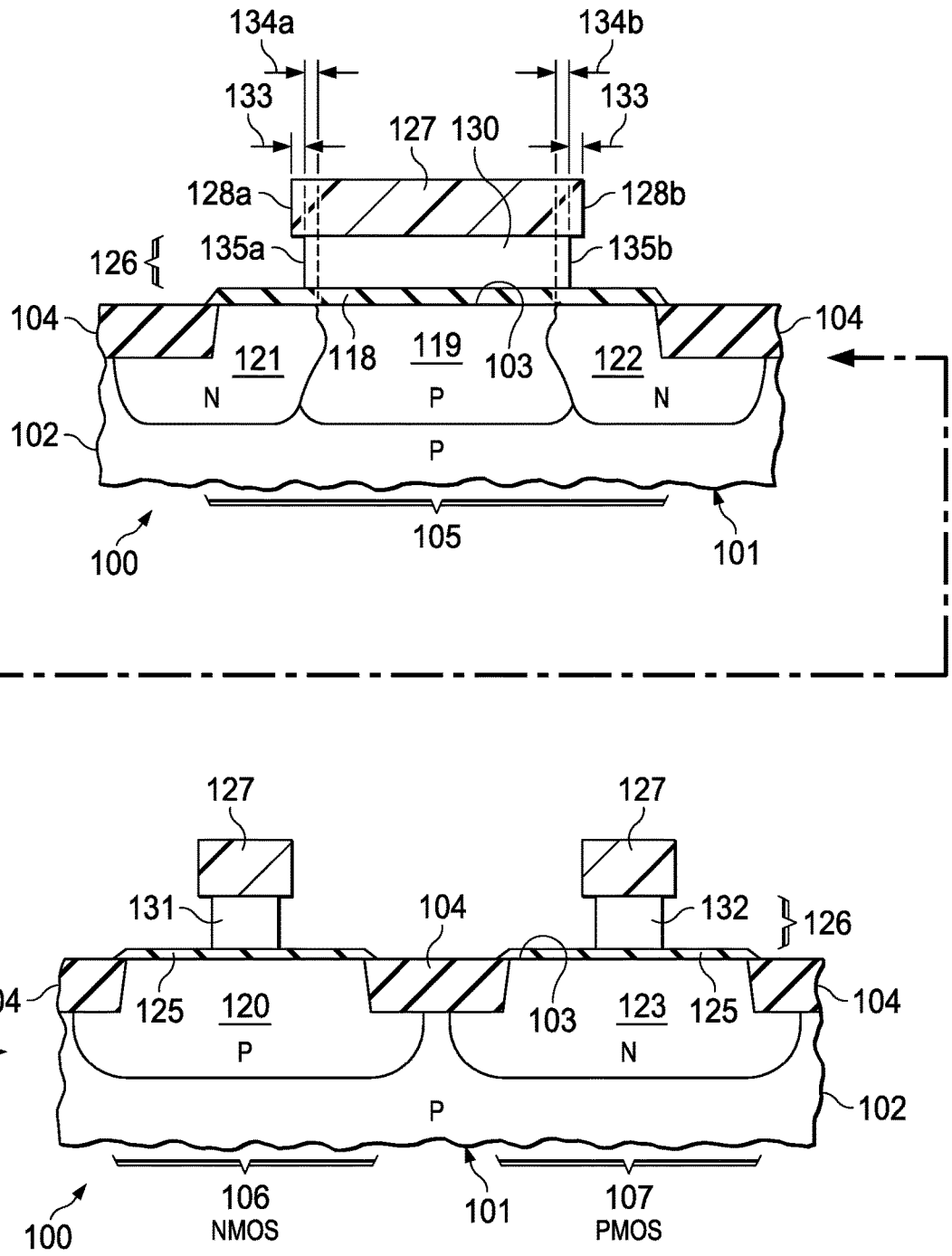

Referring to FIG. 1G, the gate material layer 126 is removed where exposed by the gate mask 127, leaving the gate material layer 126 under the gate mask 127 to form a gate electrode 130 of the analog transistor 105, a gate electrode 131 of the NMOS transistor 106, and a gate electrode 132 of the PMOS transistor 107. The gate material layer 126 may be removed by a reactive ion etch (RIE) process using fluorine radicals. The process may remove the gate material layer 126 under a perimeter of the gate mask 127 in the area for the analog transistor 105 by an undercut distance 133. The undercut distance 133 may be less than 0.05 microns, by way of example. A source-side edge 135a of the gate electrode 130 of the analog transistor 105 is located over the source well 121. A drain-side edge 135b of the gate electrode 130 is located over the drain well 122. Having the source-side edge 135a over the source well 121 and the drain-side edge 135b over the drain well 122 may advantageously maintain the desired balance between the on-state current and the area of the analog transistor 105 with the noise level and threshold precision of the analog transistor 105. The source well 121 may extend partway under the gate electrode 130 at the top surface 103 by a gate-source overlap distance 134a of 20 nanometers to 125 nanometers. The drain well 122 may extend partway under the gate electrode 130 at the top surface 103 by a gate-drain overlap distance 134b of 20 nanometers to 125 nanometers, in this example. Having the gate-source overlap distance 134a and gate-drain overlap distance 134b of 20 nanometers to 125 nanometers may further maintain the desired balance between the on-state current and the area of the analog transistor 105 with the noise level and threshold precision of the analog transistor 105.

An n-type dopant density of the source well 121 at the top surface 103 under the gate electrode 130 is less than $1 \times 10^{18}$ $cm^{-3}$, which may advantageously reduce hot carrier injection and thus improve reliability of the analog transistor 105. An n-type dopant density of the drain well 122 at the top surface 103 under the gate electrode 130 is also less than $1 \times 10^{18}$ $cm^{-3}$, which may further reduce hot carrier injection.

The gate mask 127 may be removed, partially or completely, after the gate electrodes 130, 131, and 132 are formed. Organic material in the gate mask 127, such as any remaining photoresist and BARC, as well as any amorphous carbon, may be removed by an asher process, and a wet etch process using an aqueous mixture of sulfuric acid and hydrogen peroxide, followed by a wet clean process using an aqueous mixture of hydrogen peroxide and ammonium hydroxide. Alternatively the organic material may be removed using the wet etch process followed by the wet clean process, to avoid damage to the thick gate dielectric layer 118 and the thin gate dielectric layer 125 by the asher process.

Figure 1H:
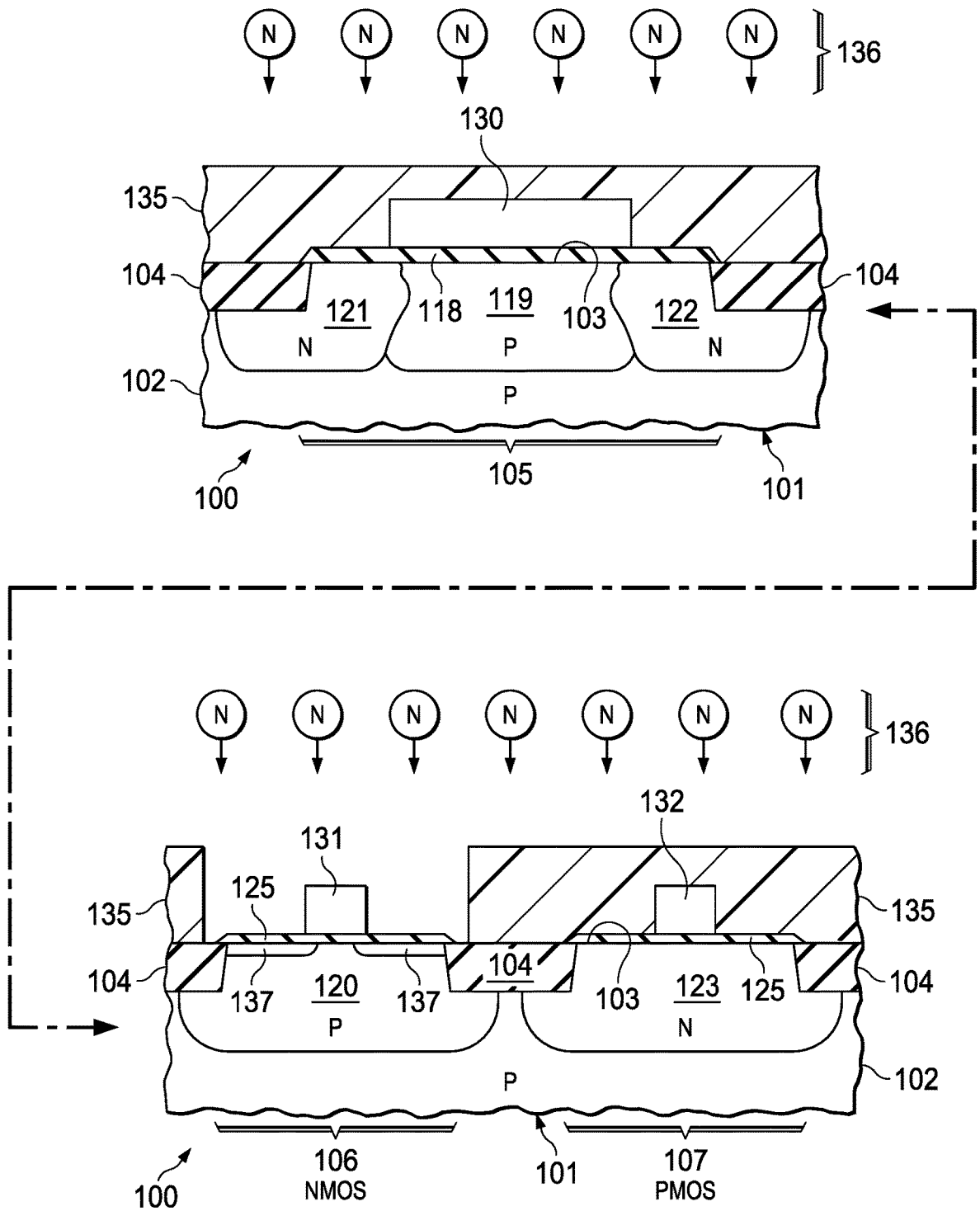

Referring to FIG. 1H, a first source/drain extension mask 135 is formed over the microelectronic device 100, exposing the NMOS transistor 106, and covering the PMOS transistor 107 and the analog transistor 105. The first source/drain extension mask 135 may include photoresist and anti-reflection material, and may be formed by a photolithographic process. Second n-type dopants 136 are implanted into the semiconductor material 102 adjacent to the gate electrode 131 of the NMOS transistor 106, to form n-type lightly-doped drain (NLDD) regions 137. The second n-type dopants 136 may include arsenic or antimony, implanted at a total dose of $3 \times 10^{14}$ $ions/cm^2$ to $3 \times 10^{15}$ $ions/cm^2$, at implant energies less than 10 keV. After the second n-type dopants 136 are activated in a subsequent process step, the NLDD regions 137 may have average dopant concentrations of $3 \times 10^{19}$ $cm^{-3}$ to $3 \times 10^{20}$ $cm^{-3}$, for example. P-type halo dopants, not shown in FIG. 1H, may be implanted into the semiconductor material 102, at a tilt angle of 15 degrees to 30 degrees, while the first source/drain extension mask 135 is in place, to form halo regions, not shown in FIG. 1H, under the gate electrode 131 adjacent to the NLDD regions 137. Blocking the second n-type dopants 136 and the p-type halo dopants from the analog transistor 105 may advantageously prevent degradation of noise and threshold precision. Doped regions under the gate electrode 130 with average dopant concentrations above $1 \times 10^{18}$ cm$^{-3}$ may undesirably increase hot carrier injection and thus increase noise. Halo regions may form regions with variable threshold, degrading both threshold precision and noise.

After the second n-type dopants 136 are implanted, the first source/drain extension mask 135 is removed. The first source/drain extension mask 135 may be removed by the methods disclosed in reference to removal of the first well implant mask 109 of FIG. 1A. Other methods of removing the first source/drain extension mask 135 are within the scope of this example.

Figure 1I:
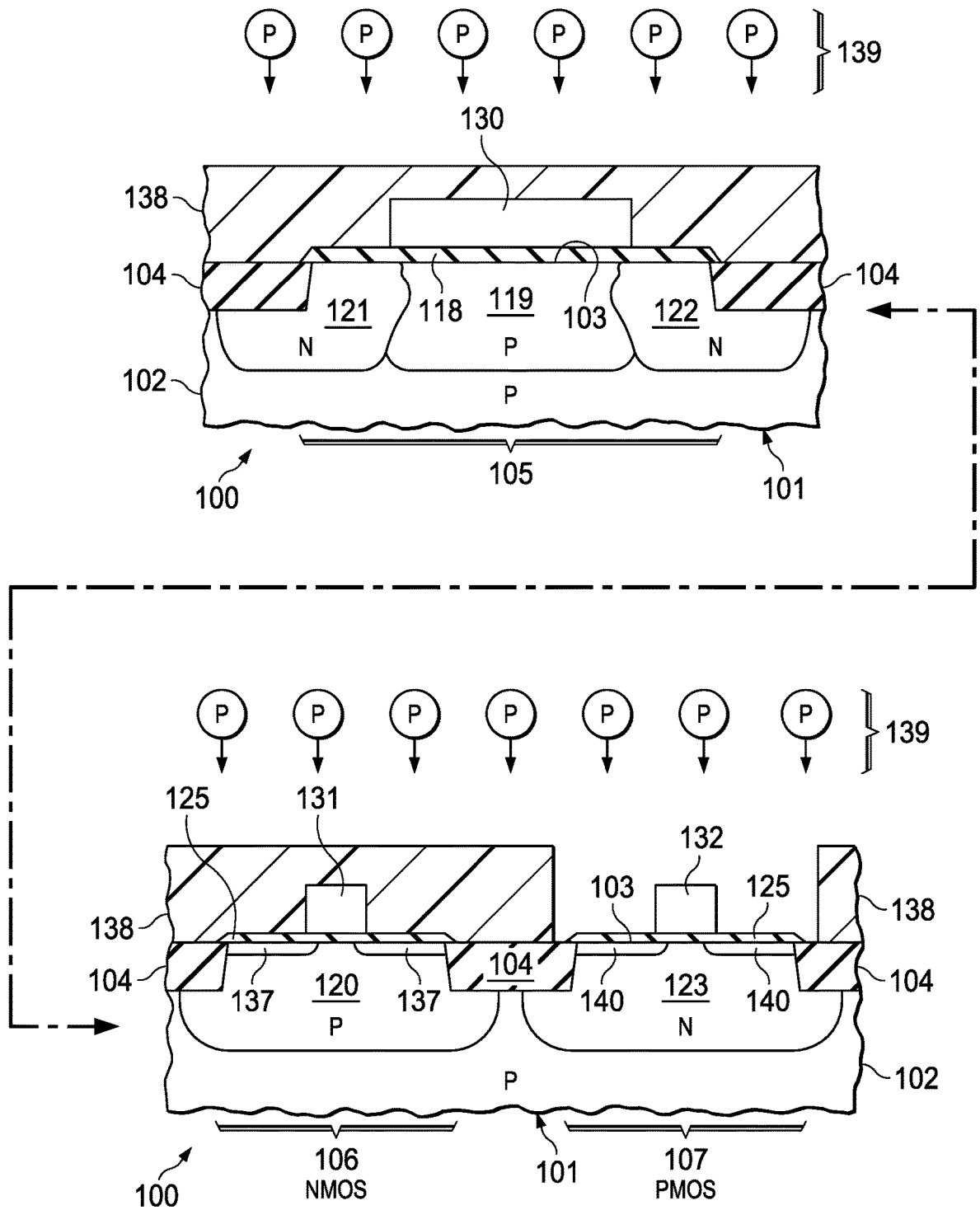

Referring to FIG. 1I, a second source/drain extension mask 138 is formed over the microelectronic device 100, exposing the PMOS transistor 107, and covering the NMOS transistor 106 and the analog transistor 105. The second source/drain extension mask 138 may include photoresist and anti-reflection material, and may be formed by a photolithographic process. Second p-type dopants 139 are implanted into the semiconductor material 102 adjacent to the gate electrode 132 of the PMOS transistor 107, to form p-type lightly-doped drain (PLDD) regions 140. The second p-type dopants 139 may include boron, gallium, or indium, implanted at a total dose of $3 \times 10^{14}$ ions/cm$^2$ to $3 \times 10^{15}$ ions/cm$^2$, at implant energies less than 10 keV. After the second p-type dopants 139 are activated in a subsequent process step, the PLDD regions 140 may have average dopant concentrations of $3 \times 10^{19}$ cm$^{-3}$ to $3 \times 10^{20}$ cm$^{-3}$, for example. N-type halo dopants, not shown in FIG. 1I, may be implanted into the semiconductor material 102, at a tilt angle of 15 degrees to 30 degrees, while the second source/drain extension mask 138 is in place, to form halo regions, not shown in FIG. 1I, under the gate electrode 132 adjacent to the PLDD regions 140.

After the second p-type dopants 139 are implanted, the second source/drain extension mask 138 is removed. The second source/drain extension mask 138 may be removed by the methods disclosed in reference to removal of the first source/drain extension mask 135 of FIG. 1H. Other methods of removing the second source/drain extension mask 138 are within the scope of this example.

Figure 1J:
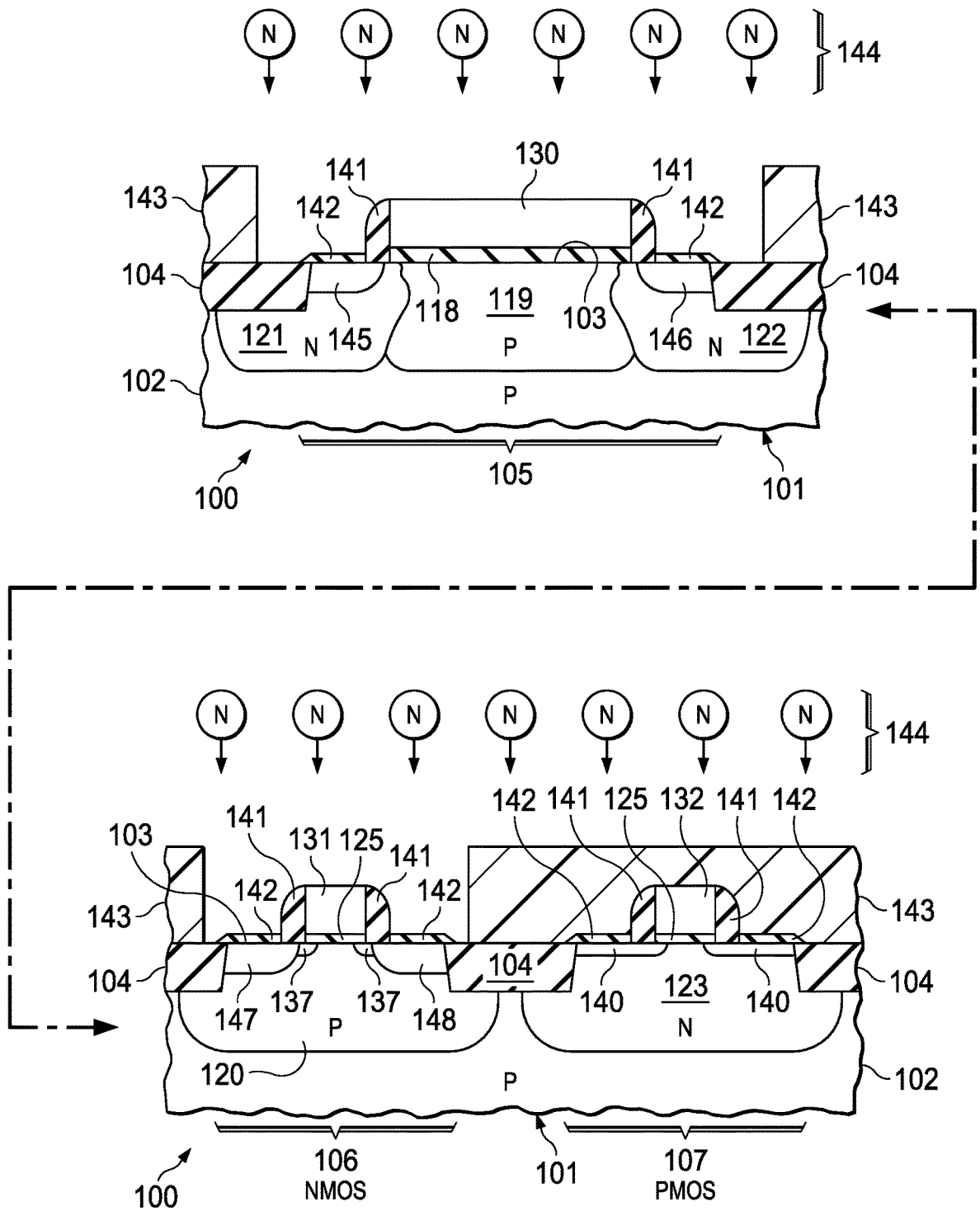

Referring to FIG. 1J, sidewall spacers 141 are formed on lateral surfaces of the gate electrodes 130, 131 and 132. The sidewall spacers 141 may include one or more layers of silicon nitride or silicon dioxide, and may extend 100 nanometers to 300 nanometers outward from the gate electrodes 130, 131 and 132. The sidewall spacers 141 may be formed by forming one or more conformal layers of silicon nitride or silicon dioxide over the gate electrodes 130, 131 and 132, followed by an anisotropic etch process, such as an RIE process, to remove the conformal layers from horizontal surfaces of the microelectronic device 100, leaving the sidewall spacers 141 on the lateral surfaces of the gate electrodes 130, 131 and 132. The thick gate dielectric layer 118 may be partially or completely removed in the analog transistor 105 where exposed by the gate electrode 130 during formation of the sidewall spacers 141, as indicated in FIG. 1J. Similarly, the thin gate dielectric layer 125 may be partially or completely removed in the NMOS transistor 106 and the PMOS transistor 107 where exposed by the gate electrodes 131 and 132. A temporary oxide layer 142 may be formed over the semiconductor material 102 and any remnants of the thick gate dielectric layer 118 and the thin gate dielectric layer 125.

A first source/drain implant mask 143 is formed over the microelectronic device 100, exposing the analog transistor 105 and the NMOS transistor 106, and covering the PMOS transistor 107. The first source/drain implant mask 143 may include photoresist and anti-reflection material, and may be formed by a photolithographic process. Third n-type dopants 144 are implanted into the semiconductor material 102 where exposed by the first source/drain implant mask 143, including the semiconductor material 102 adjacent to the sidewall spacers 141 on the gate electrodes 130 and 131 of the analog transistor 105 and the NMOS transistor 106, and are activated after the first source/drain implant mask 143 is subsequently removed, to form a source contact region 145 of the analog transistor 105 in the source well 121, to form a drain contact region 146 of the analog transistor 105 in the drain well 122, to form a source contact region 147 of the NMOS transistor 106 in the p-type well 120, and to form a drain contact region 148 of the NMOS transistor 106 in the p-type well 120. The third n-type dopants 144 are blocked from the semiconductor material 102 directly under the gate electrodes 130 and 131. The source contact region 145 of the analog transistor 105 has a higher average dopant concentration than the source well 121, and the drain contact region 146 of the analog transistor 105 has a higher average dopant concentration than the drain well 122. For example, the average dopant concentrations of the source contact region 145 and the drain contact region 146 may be at least 100 times greater than the average dopant concentrations of the source well 121 and the drain well 122.

After the third n-type dopants 144 are implanted, the first source/drain implant mask 143 is removed, for example as disclosed in reference to removal of the first source/drain extension mask 135 of FIG. 1H. The source contact region 145 and the drain contact region 146 of the analog transistor 105 do not extend under the gate electrode 130 of the analog transistor 105, which may advantageously maintain the low noise and threshold precision attained by blocking the second n-type dopants 136 of FIG. 1H, used to form the NLDD regions 137 of FIG. 1H, from the analog transistor 105.

Figure 1K:
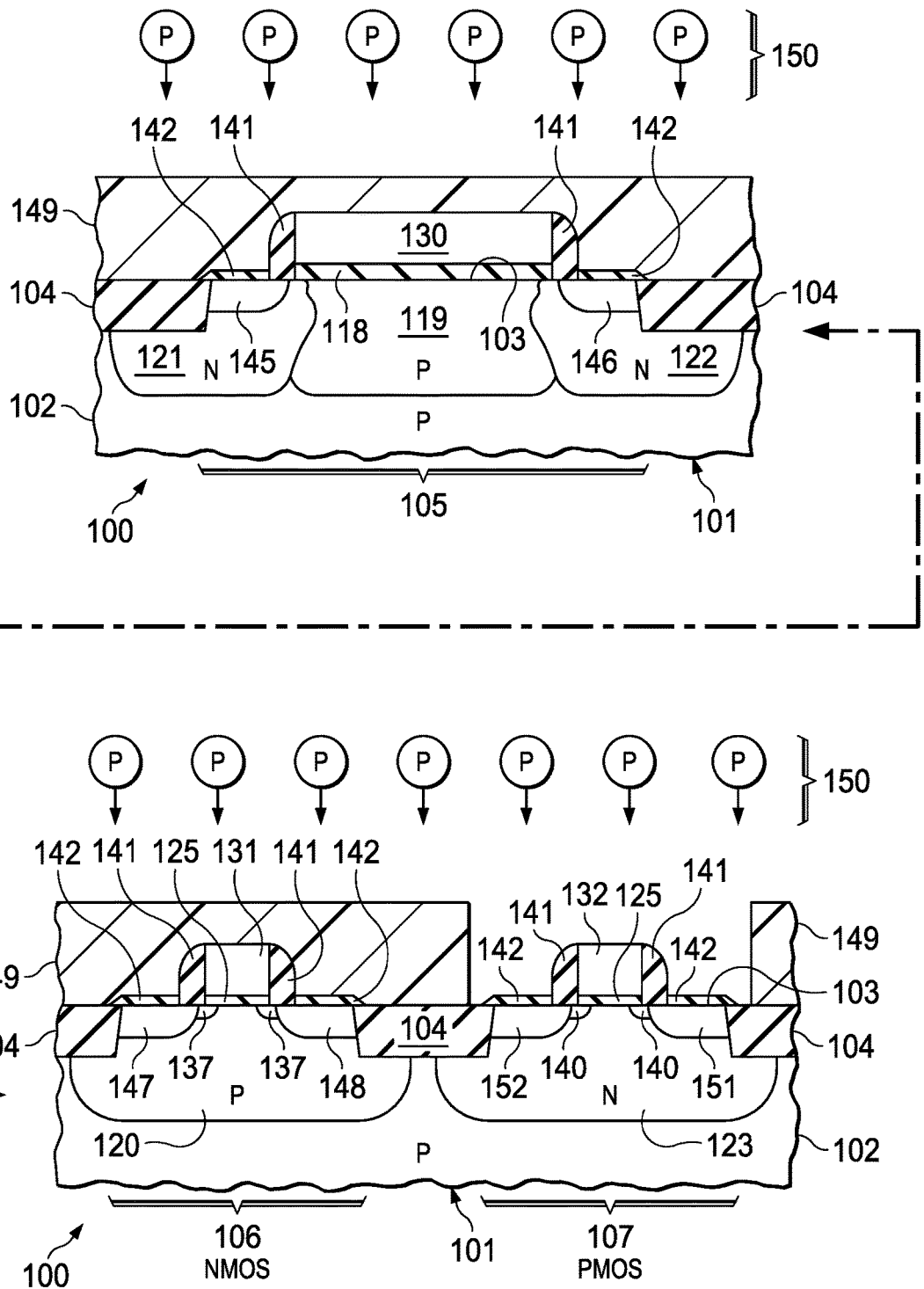

Referring to FIG. 1K, a second source/drain implant mask 149 is formed over the microelectronic device 100, exposing the PMOS transistor 107, and covering the analog transistor 105 and the NMOS transistor 106. The second source/drain implant mask 149 may have a composition and structure similar to the first source/drain implant mask 143. Third p-type dopants 150 are implanted into the semiconductor material 102 where exposed by the second source/drain implant mask 149, including the semiconductor material 102 adjacent to the sidewall spacers 141 on the gate electrode 132 of the PMOS transistor 107, and are activated after the second source/drain implant mask 149 is subsequently removed, to form a source contact region 151 and a drain contact region 152 of the PMOS transistor 107 in the n-type well 123. The third p-type dopants 150 are blocked from the semiconductor material 102 directly under the gate electrode 132. After the third p-type dopants 150 are implanted, the second source/drain implant mask 149 is removed, for example as disclosed in reference to removal of the first source/drain extension mask 135 of FIG. 1H.

Figure 1L:
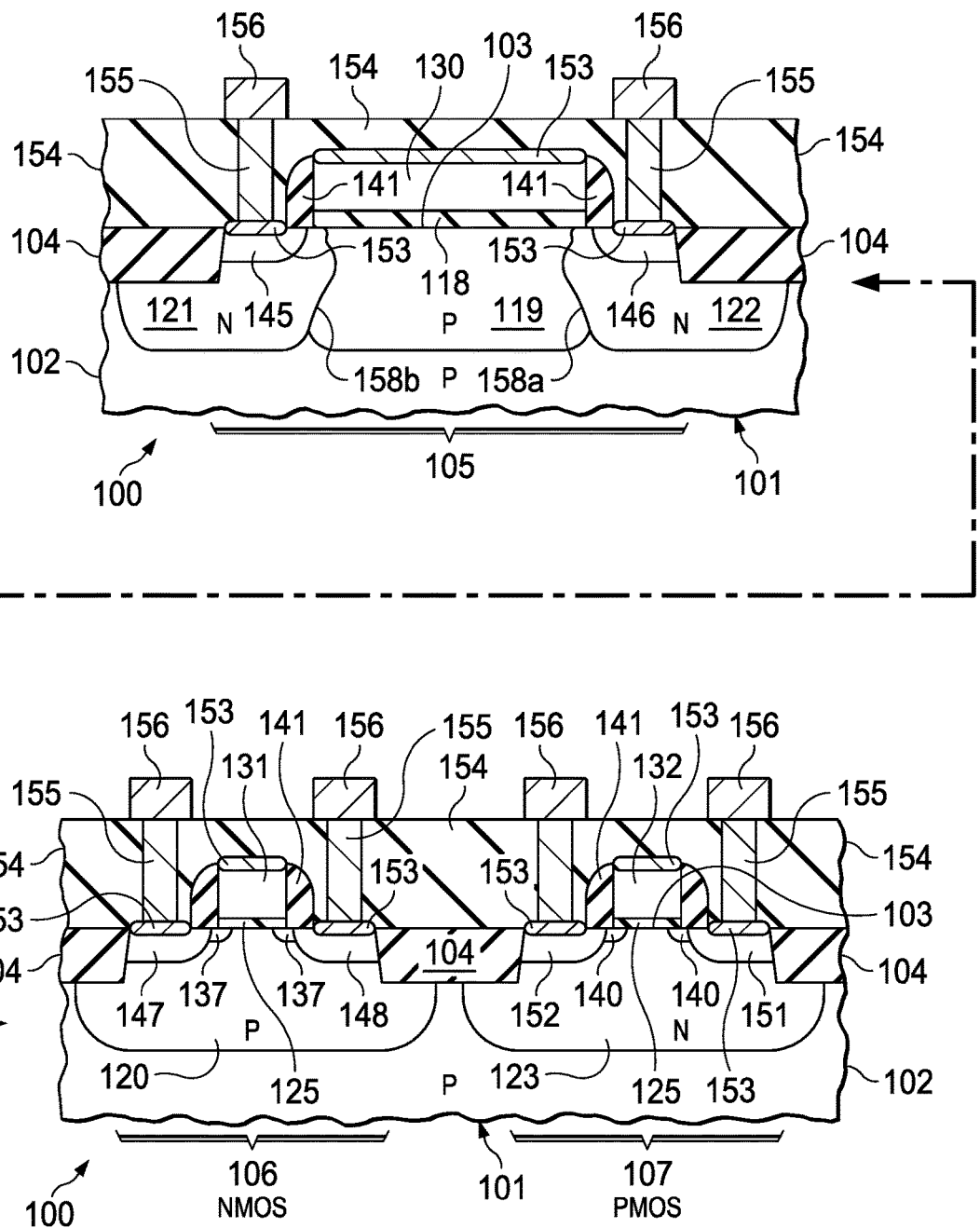

Referring to FIG. 1L, metal silicide 153 may be formed on exposed silicon at the top surface 103 of the semiconductor material 102. In versions of this example in which the gate electrodes 130, 131, and 132 include polysilicon, the metal silicide 153 may be formed at tops of the gate electrodes 130, 131, and 132, as depicted in FIG. 1L. The metal silicide 153 may include titanium silicide, cobalt silicide, or nickel silicide, by way of example. The metal silicide 153 may be formed by forming a layer of metal on the microelectronic device 100, contacting the exposed silicon. Subsequently, the microelectronic device 100 is heated to react the layer of metal with the exposed silicon to form the metal silicide 153. Unreacted metal is removed from the microelectronic device 100, leaving the metal silicide 153 in place. The unreacted metal may be removed by a wet etch process using an aqueous mixture of sulfuric acid and hydrogen peroxide, or an aqueous mixture of nitric acid and hydrochloric acid, by way of example. The metal silicide 153 may advantageously provide low resistance electrical connections to the source contact region 145, the drain contact region 146, and the gate electrode 130 of the analog transistor 105, to the source contact region 147, the drain contact region 148, and the gate electrode 131 of the NMOS transistor 106, and to the source contact region 151, the drain contact region 152, and the gate electrode 132 of the PMOS transistor 107.

A pre-metal dielectric (PMD) layer 154 of the microelectronic device 100 is formed over the substrate 101, the field relief dielectric layer 104, the transistors 105, 106, and 107, and the metal silicide 153. The PMD layer 154 is electrically non-conductive, and may include one or more sublayers of dielectric material. By way of example, the PMD layer 154 may include a PMD liner, not shown, of silicon nitride, formed by an LPCVD process or a PECVD process, contacting the substrate 101, the field relief dielectric layer 104, the transistors 105, 106, and 107, and the metal silicide 153. The PMD layer 154 may also include a planarized layer, not shown, of silicon dioxide, phosphosilicate glass (PSG), fluorinated silicate glass (FSG), or borophosphosilicate glass (BPSG), formed by a PECVD process using tetraethyl orthosilicate (TEOS), formally named tetraethoxysilane, a high density plasma (HDP) process, or a high aspect ratio process (HARP) using TEOS and ozone, on the PMD liner. The PMD layer 154 may further include a PMD cap layer, not shown, of silicon nitride, silicon carbide, or silicon carbonitride, suitable for an etch-stop layer of a chemical-mechanical polish (CMP) stop layer, formed by a PECVD process using TEOS and bis(tertiary-butyl-amino)silane (BTBAS), on the planarized layer. Other layer structures and compositions for the PMD layer 154 are within the scope of this example.

Contacts 155 are formed through the PMD layer 154, making electrical connections to the metal silicide 153 on the source contact region 145 and the drain contact region 146 of the analog transistor 105, on the source contact region 147 and the drain contact region 148 of the NMOS transistor 106, and to the source contact region 151 and the drain contact region 152 of the PMOS transistor 107. The contacts 155 may also make electrical connections to the gate electrodes 130, 131, and 132, out of the plane of FIG. 1L. The contacts 155 are electrically conductive, and may include an adhesion layer, not shown, of titanium contacting the PMD layer 154 and the metal silicide 153, a barrier liner, not shown, of titanium nitride on the adhesion layer, and a tungsten core, not shown, on the contact liner. The contacts 155 may be formed by etching contact holes through the PMD layer 154 to expose the metal silicide 153. The adhesion layer may be formed by sputtering titanium into the contact holes. The barrier liner may be formed by using an atomic layer deposition (ALD) process to form titanium nitride. The tungsten core may be formed by a metalorganic chemical vapor deposition (MOCVD) process using tungsten hexafluoride ($WF_6$) reduced by silane initially and hydrogen after a layer of tungsten is formed on the contact liner. The tungsten, titanium nitride, and titanium are subsequently removed from a top surface of the PMD layer 154 by an etch process, a tungsten CMP process, or a combination of both, leaving the contacts 155 extending to the top surface of the PMD layer 154. Other structures and compositions for the contacts 155, such as selective deposition of cobalt, are within the scope of this example.

Interconnects 156 are formed on the PMD layer 154, making electrical connections to the contacts 155. The interconnects 156 are electrically conductive. In one version of this example, the interconnects 156 may have an etched aluminum structure, and may include an adhesion layer, not shown, of titanium nitride or titanium tungsten, on the PMD layer 154, an aluminum layer, not shown, with a few atomic percent of silicon, titanium, or copper, on the adhesion layer, and a barrier layer, not shown, of titanium nitride on the aluminum layer. The etched aluminum interconnects may be formed by depositing the adhesion layer, the aluminum layer, and the barrier layer, and forming an etch mask, not shown, followed by an RIE process to etch the barrier layer, the aluminum layer, and the adhesion layer where exposed by the etch mask, and subsequently removing the etch mask. In another version of this example, the interconnects 156 may have a damascene structure, and may include a barrier liner of tantalum and tantalum nitride in an interconnect trench in an intra-metal dielectric (IMD) layer, not shown, on the PMD layer 154, with a copper fill metal in the interconnect trench on the barrier liner. The damascene interconnects may be formed by depositing the IMD layer on the PMD layer 154, and etching the interconnect trenches through the IMD layer to expose the contacts 155. The barrier liner may be formed by sputtering tantalum onto the IMD layer and exposed PMD layer 154 and contacts 155, and forming tantalum nitride on the sputtered tantalum by an ALD process. The copper fill metal may be formed by sputtering a seed layer, not shown, of copper on the barrier liner, and electroplating copper on the seed layer to fill the interconnect trenches. Copper and barrier liner metal is subsequently removed from a top surface of the IMD layer by a copper CMP process. In further version of this example, the interconnects 156 may have a plated structure, and may include an adhesion layer, not shown, on the PMD layer 154 and the contacts 155, with copper interconnects on the adhesion layer. The plated interconnects may be formed by sputtering the adhesion layer, containing titanium, on the PMD layer 154 and contacts 155, followed by sputtering a seed layer, not shown, of copper on the adhesion layer. A plating mask is formed on the seed layer that exposes areas for the interconnects 156. The copper interconnects are formed by electroplating copper on the seed layer where exposed by the plating mask. The plating mask is removed, and the seed layer and the adhesion layer are removed by wet etching between the interconnects.

During operation of the microelectronic device 100, the analog transistor 105 of this example may be operated at a drain-source bias of 4 volts to 6 volts, and may attain the advantages of low noise, high threshold precision, and high on-state current disclosed in reference to FIG. 1A through FIG. 1K. A pn junction 158a between the drain well 122 and the body well 119, referred to herein as the drain-body junction 158a, may have an undulating profile, as indicated in FIG. 1C, due to the plurality of doses of the first p-type dopants 112 of FIG. 1A and the first n-type dopants 116 of FIG. 1B. Similarly, a pn junction 158b between the source well 121 and the body well 119, referred to herein as the source-body junction 158b, may have an undulating profile that is reversed from the drain-body junction 158a, as indicated in FIG. 1C. The drain-body junction 158a of this example may have a drain-body breakdown voltage of 10.5 volts to 11.5 volts. The drain-body breakdown voltage is measured by applying a positive potential to the drain well 122 with respect to the body well 119 and increasing the applied potential until current through the drain-body junction 158a reaches a specified value, for example, 100 nanoamperes per micron of junction width. The drain-body breakdown voltage of 10.5 volts to 11.5 volts is a consequence of forming the drain-side edge 115b of the second well implant mask 114 of FIG. 1B coincident with the drain-side edge 110b of the first well implant mask 109 of FIG. 1A, as disclosed in reference to FIG. 1B. A drain-body breakdown voltage less than 10.5 volts would indicate the implanted area for the first p-type dopants 112 overlapped with the implanted area for the first n-type dopants 116 of FIG. 1B by a lateral distance greater than an alignment tolerance of the first and second well implant masks 109 and 114, having undesired effects on the threshold precision and noise of the analog transistor 105. A drain-body breakdown voltage greater than 11.5 volts would indicate the implanted areas for the first p-type dopants 112 and the first n-type dopants 116 were separated by a lateral distance greater than the alignment tolerance, also having undesired effects on the threshold precision and noise. Similarly, the source-body junction 158b of this example may have a source-body breakdown voltage of 10.5 volts to 11.5 volts, as a consequence of forming the source-side edge 115a of the second well implant mask 114 coincident with the source-side edge 110a of the first well implant mask 109. Having a source-body breakdown voltage outside the range of 10.5 volts to 11.5 would indicate overlaps or separations of the implanted areas for the first p-type dopants 112 and the first n-type dopants 116, with corresponding undesired effects on the threshold precision and noise.

Figure 2:
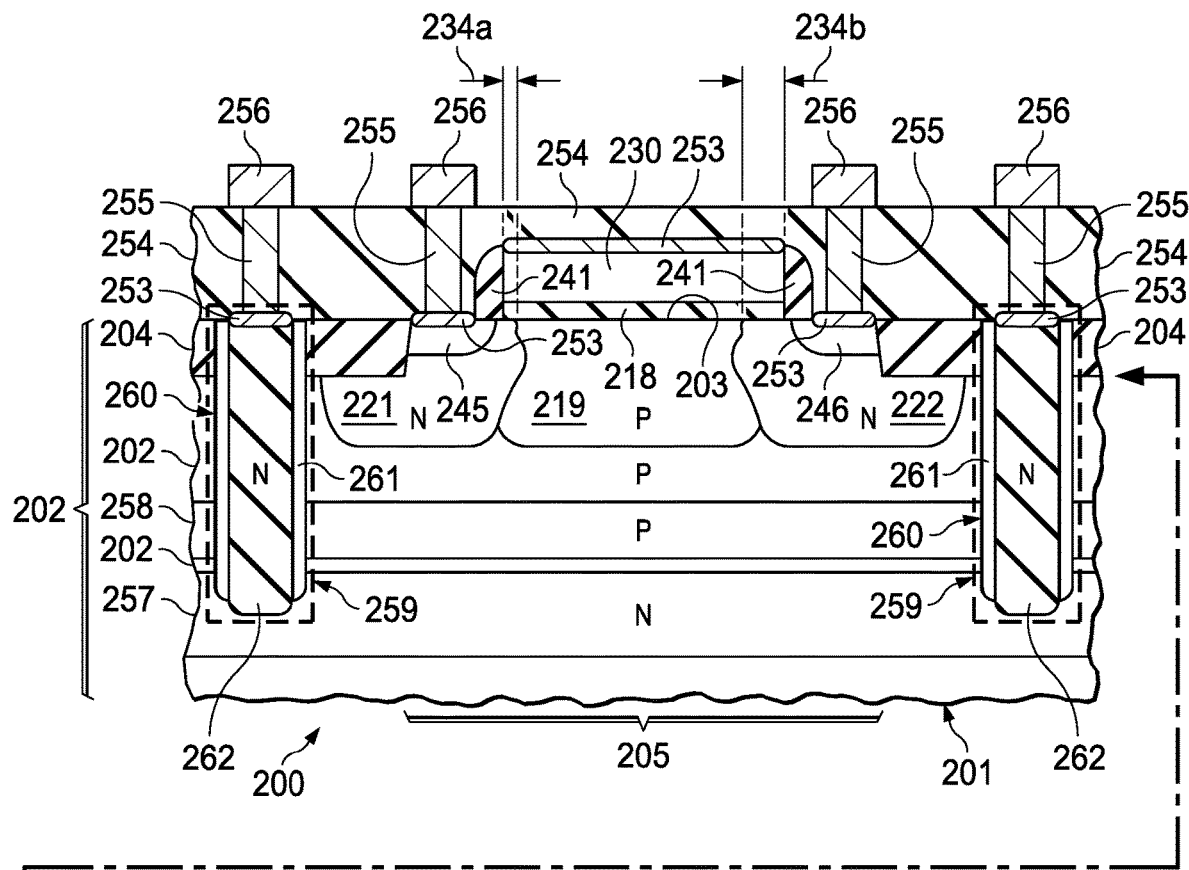
FIG. 2 is of another example microelectronic device that includes an analog transistor.
Figure 2:
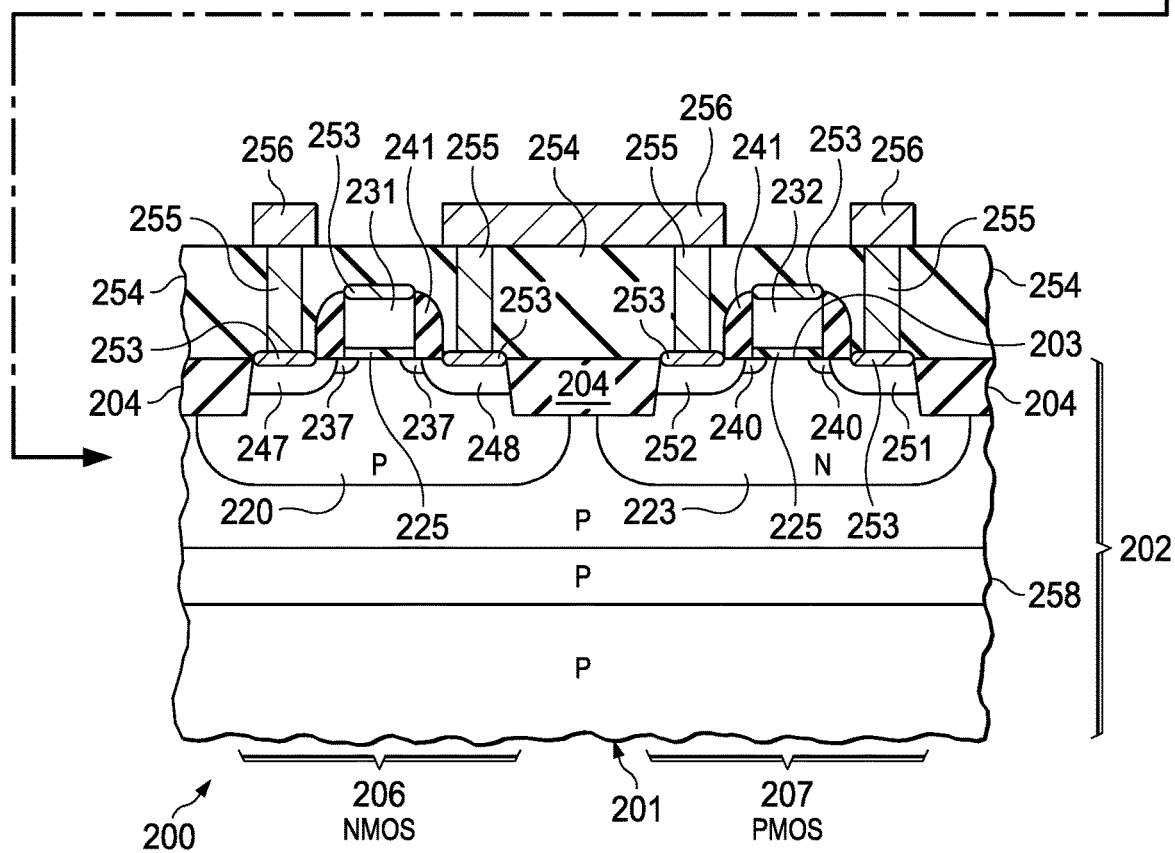

FIG. 2 is of another example microelectronic device that includes an analog transistor. The microelectronic device 200 of this example is formed on a substrate 201 having a semiconductor material 202. In this example, the semiconductor material 202 is p-type. The semiconductor material 202 has a top surface 203. The microelectronic device 200 includes the analog transistor 205, an NMOS transistor 206, and a PMOS transistor 207. The analog transistor 205 of this example is described as an n-channel analog transistor. The microelectronic device 200 includes a field relief dielectric layer 204 at the top surface 203, laterally separating and isolating the transistors 205, 206, and 207.

The microelectronic device 200 of this example includes an n-type buried layer (NBL) 257 in the semiconductor material 202, located 2 microns to 5 microns below the top surface 203. In alternate versions of this example, the NBL 257 may be located deeper than 5 microns in the substrate 201. The NBL 257 may have an average dopant concentration of $5 \times 10^{18}$ cm$^{-3}$ to $5 \times 10^{19}$ cm$^{-3}$, by way of example. The NBL 257 extends below the analog transistor 205, as shown in FIG. 2. The NBL 257 may optionally be patterned, and so may not necessarily extend below the NMOS transistor 206 and the PMOS transistor 207; FIG. 2 depicts the substrate 201 below the NMOS transistor 206 and the PMOS transistor 207 as being free of the NBL 257. In alternate versions of this example, the NBL 257 may extend below the NMOS transistor 206 and the PMOS transistor 207. The NBL 257 may be formed by implanting n-type dopants such as arsenic or antimony into the substrate 201 in an area for the NBL 257, followed by a thermal drive to activate the implanted n-type dopants, and a subsequent epitaxial growth process to form an additional portion of the semiconductor material 202 over the NBL 257, extending to the top surface 203.

The microelectronic device 200 of this example includes a p-type layer buried (PBL) 259 in the semiconductor material 202 above the NBL 257. The PBL 259 may have an average dopant concentration of $3 \times 10^{17}$ cm$^{-3}$ to $3 \times 10^{18}$ cm$^{-3}$, by way of example. The PBL 259 extends below the analog transistor 205, as shown in FIG. 2. The PBL 259 may optionally extend across the microelectronic device 200, and so may extend below the NMOS transistor 206 and the PMOS transistor 207, as depicted in FIG. 2. Alternatively, the PBL 259 may be patterned so that the substrate 201 below the NMOS transistor 206 and the PMOS transistor 207 would be free of the PBL 259.

The microelectronic device 200 of this example includes an isolation structure 260 laterally surrounding the analog transistor 205 and extending through the field relief dielectric layer 204 to the NBL 257. The isolation structure 260 may be formed in a deep trench 261 with a dielectric liner 262 contacting the semiconductor material 202. The dielectric liner 262 is electrically non-conductive, and may include silicon dioxide, silicon nitride, or silicon oxynitride, by way of example. The isolation structure 260 may further include a conductive fill material 263 in the deep trench 261 on the dielectric liner 262, contacting the NBL 257 at a bottom of the deep trench 261. The conductive fill material 263 provides an electrical connection to the NBL 257, and may include doped polysilicon, for example. The conductive fill material 263 is electrically isolated from the semiconductor material 202 by the dielectric liner 262. The isolation structure 260 may be formed by forming the deep trench 261 through the field relief dielectric layer 204 and through the semiconductor material 202 to the NBL 257. The deep trench 261 may be formed by an iterated two-step deep RIE process which alternates between forming a polymer on sidewalls of the deep trench 261 to prevent lateral etching and vertical etching at the bottom of the deep trench 261, until a desired depth of the deep trench 261 is attained. Alternatively, the deep trench 261 may be formed by a continuous deep RIE process which concurrently forms the polymer and removes silicon at the bottom of the deep trench 261. The dielectric liner 262 may be formed by a thermal oxidation process which forms a layer of thermal oxide on sidewalls of the deep trench 261. Additional dielectric material such as silicon dioxide, silicon nitride, or silicon oxynitride, may be added to the dielectric liner 262 by one or more CVD or PECVD processes. The conductive fill material 263 may be formed by decomposition of silane, and may be in situ doped by adding dopant reagents such as phosphine ($PH_3$).

The analog transistor 205 of this example has a body well 219, which is p-type, in the semiconductor material 202, above the PBL 259 and extending to the top surface 203 of the semiconductor material 202. The analog transistor 205 of this example also has a source well 221 in the semiconductor material 202 abutting the body well 219, above the PBL 259 and extending to the top surface 203. The analog transistor 205 of this example further has a drain well 222 in the semiconductor material 202 abutting the body well 219 opposite from the source well 221, above the PBL 259 and extending to the top surface 203.

The NMOS transistor 206 is located in a p-type well 220, and the PMOS transistor 207 is located in an n-type well 223. The body well 219, the p-type well 220, the source well 221, the drain well 222, and the n-type well 223 extend deeper in the semiconductor material 202 than the field relief dielectric layer 204. The body well 219 and the p-type well 220 are p-type, and are formed concurrently, for example, by the process disclosed in reference to FIG. 1A and FIG. 1C through FIG. 1E, and have similar distributions of p-type dopants. The source well 221, the drain well 222, and the n-type well 223 are n-type, and are formed concurrently, for example, by the process disclosed in reference to FIG. 1B through FIG. 1E, and have similar distributions of n-type dopants. The body well 219, the source well 221, and the drain well 222 are formed with edges of implant masks coincident with alignment tolerances, as disclosed in reference to FIG. 1A and FIG. 1B, which results in the analog transistor 205 having a drain-body breakdown voltage of 10.5 volts to 11.5 volts, and having a source-body breakdown voltage of 10.5 volts to 11.5 volts.

The analog transistor 205 includes a thick gate dielectric layer 218 at the top surface 203, and a gate electrode 230 on the thick gate dielectric layer 218. The thick gate dielectric layer 218 and the gate electrode 230 may be formed as disclosed in reference to FIG. 1C through FIG. 1G. The gate electrode 230 is located above the body well 219, and extends partway over the source well 221 and partway over the drain well 222. The source well 221 may extend partway under the gate electrode 230 at the top surface 203 by a gate-source overlap distance 234a of 20 nanometers to 125 nanometers. In this example, the gate electrode 230 may extend farther over the drain well 222 than over the source well 221, as depicted in FIG. 2, which may enable the analog transistor 205 to operate with a drain potential higher than 6 volts with respect to the source well 221, while the gate electrode 230 is operated at 4 volts to 6 volts with respect to the source well 221. The drain well 222 may extend partway under the gate electrode 230 at the top surface 203 by a gate-drain overlap distance 234b greater than 125 nanometers, in this example.

The NMOS transistor 206 and the PMOS transistor 207 include a thin gate dielectric layer 225 at the top surface 203 of the semiconductor material 202. The NMOS transistor 206 includes a gate electrode 231 on the thin gate dielectric layer 225 above the p-type well 220. The PMOS transistor 207 includes a gate electrode 232 on the thin gate dielectric layer 225 above the n-type well 221. The thin gate dielectric layer 225, and the gate electrodes 231 and 232 may be formed as disclosed in reference to FIG. 1D through FIG. 1G.

The microelectronic device 200 includes sidewall spacers 241 on lateral surfaces of the gate electrodes 230, 231, and 232. The sidewall spacers 241 may be formed as disclosed in reference to FIG. 1J. The analog transistor 205 includes a source contact region 245 in the source well 221 and includes a drain contact region 246 in the drain well 222. The NMOS transistor 206 includes a source contact region 247 and a drain contact region 248 in the p-type well 220. The source contact region 245 and the drain contact region 246 of the analog transistor 205, and the source contact region 247 and the drain contact region 248 of the NMOS transistor 206 may be formed concurrently, as disclosed in reference to FIG. 1J. The source contact region 245 and the drain contact region 246 of the analog transistor 205 extend partway under the sidewall spacers 241 but do not extend under the gate electrode 230 of the analog transistor 205. The NMOS transistor 206 includes NLDD regions 237 abutting the source contact region 247 and the drain contact region 248, and extending partway under the gate electrode 231. The NLDD regions 237 may be formed as disclosed in reference to FIG. 1H.

The PMOS transistor 207 includes a source contact region 251 and a drain contact region 252 in the n-type well 223. The source contact region 251 and the drain contact region 252 may be formed as disclosed in reference to FIG. 1K. The PMOS transistor 207 includes PLDD regions 240 abutting the source contact region 251 and the drain contact region 252, and extending partway under the gate electrode 232. The PLDD regions 240 may be formed as disclosed in reference to FIG. 1I.

The microelectronic device 200 includes metal silicide 253 on the source contact regions 245, 247, and 251, on the drain contact regions 246, 248, and 252, on the gate electrodes 230, 231, and 232, and on the conductive fill material 263 of the isolation structure 260. The microelectronic device 200 includes a PMD layer 254 over the substrate 201, the analog transistor 205, the NMOS transistor 206, the PMOS transistor 207, and the metal silicide 253. The microelectronic device 200 includes contacts 255 through the PMD layer 254 to the metal silicide 253, making electrical connections through the metal silicide 253 to the source contact regions 245, 247, and 251, to the drain contact regions 246, 248, and 252, to the gate electrodes 230, 231, and 232, and to the conductive fill material 263. The microelectronic device 200 further includes interconnects 256 making electrical connections on the contacts 255, providing electrical connections to the source contact regions 245, 247, and 251, to the drain contact regions 246, 248, and 252, to the gate electrodes 230, 231, and 232, and to the conductive fill material 263. The contact 255 over the drain contact region 248 of the NMOS transistor 206 may be directly connected to the contact 255 over the drain contact region 252 of the PMOS transistor 207 through one of the interconnects 256, so that the NMOS transistor 206 and the PMOS transistor 207 are configured as an inverter. The metal silicide 253, the PMD layer 254, the contacts 255 and the interconnects 256 may be formed as disclosed in reference to FIG. 1L.

The isolation structure 260 combined with the NBL 257 electrically isolates the analog transistor 205 from the semiconductor material 202 below the NBL 257 and outside of the isolation structure 260, enabling the analog transistor 205 to be operated at a source potential higher than a substrate potential of the semiconductor material 202 below the NBL 257. During operation of the microelectronic device 200, the PBL 259 between the NBL 257 and the drain well 222 may advantageously prevent punch-through from the drain well 222 to the NBL 257.

Figure 3A:
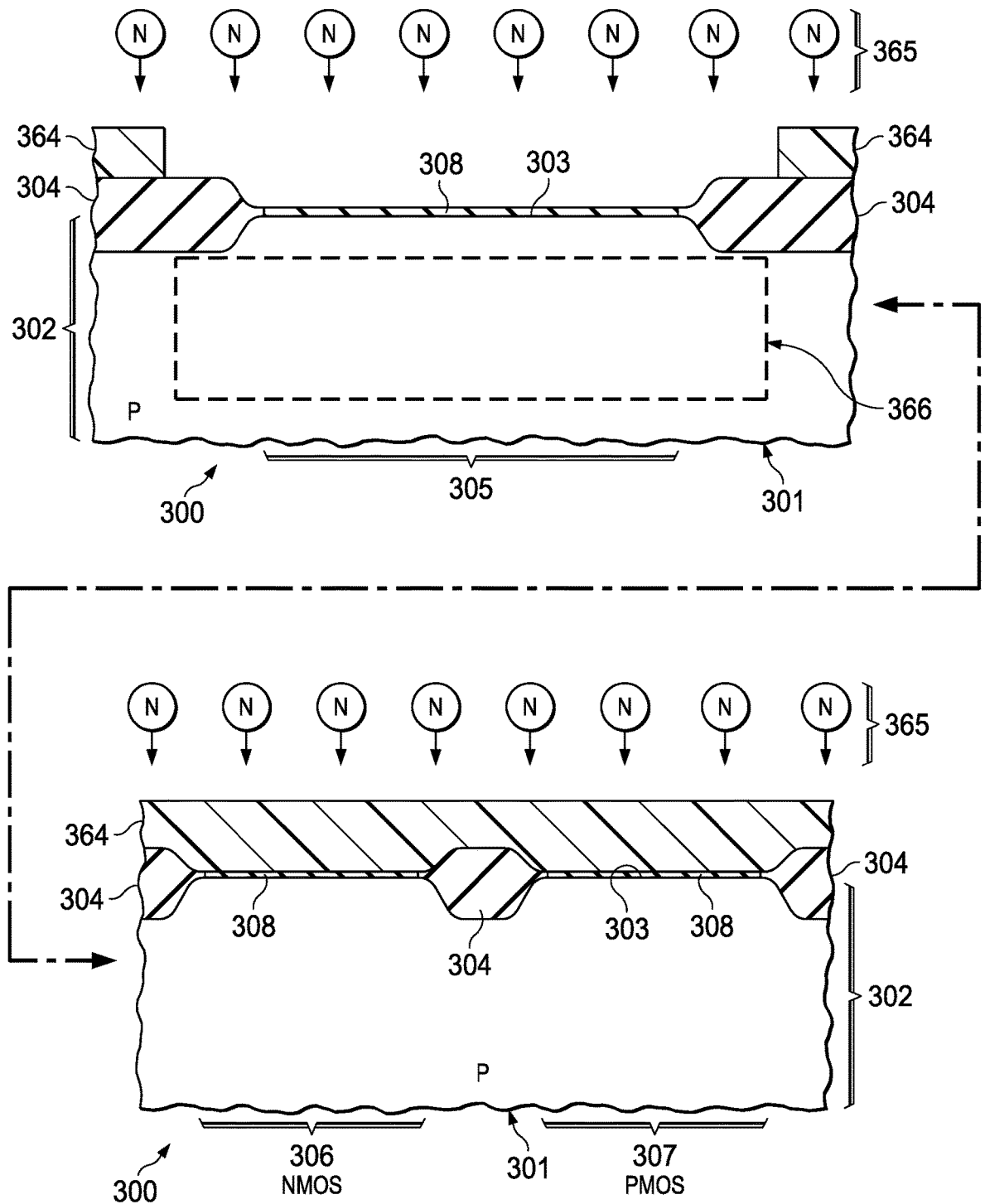
FIG. 3A through FIG. 3H are cross sections of a further example microelectronic device that includes an analog transistor, depicted in stages of another example method of formation.

FIG. 3A through FIG. 3H are cross sections of a further example microelectronic device that includes an analog transistor, depicted in stages of another example method of formation. Referring to FIG. 3A, the microelectronic device 300 is formed in and on a substrate 301. The microelectronic device 300 may be manifested as any of the device types disclosed in reference to the microelectronic device 100 of FIG. 1A. The substrate 301 may be part of a semiconductor wafer or other structure suitable for forming the microelectronic device 300. The substrate 301 includes a semiconductor material 302, such as silicon. Other semiconductor materials are within the scope of this example. In this example, the semiconductor material 302 may be p-type, as indicated in FIG. 3A. The semiconductor material 302 has a top surface 303.

A field relief dielectric layer 304 is formed on the semiconductor material 302 at the top surface 303. The field relief dielectric layer 304 may be formed by a LOCOS process and have a LOCOS structure, with tapered edges, and extending partway into the semiconductor material 302 and extending partway above the semiconductor material 302, as depicted in FIG. 3A. Alternatively, the field relief dielectric layer 304 may be formed by an STI process and have the STI structure disclosed in reference to FIG. 1A. The field relief dielectric layer 304 laterally surrounds areas of the semiconductor material 302 for the analog transistor 305, an NMOS transistor 306 and a PMOS transistor 307. In this example, the analog transistor 305 is described as a p-channel analog transistor.

A first protective oxide layer 308 may be formed at the top surface 303 of the semiconductor material 302 exposed by the field relief dielectric layer 304. The first protective oxide layer 308 may have a composition and thickness as disclosed in reference to FIG. 1A.

A deep well mask 364 is formed over the substrate 301, exposing an area for the analog transistor 305, and covering areas for the NMOS transistor 306 and the PMOS transistor 307. The deep well mask 364 may include photoresist, and may be formed by a photolithographic process. The deep well mask 364 may be 1.0 micron to 1.5 microns thick, by way of example.

Deep well n-type dopants 365 such as phosphorus are implanted into the semiconductor material 302 where exposed by the deep well mask 364, to form a deep implanted region 366. The deep well n-type dopants 365 may be implanted in two or more doses at a total dose of $5 \times 10^{12}$ ions/cm$^2$ to $1 \times 10^{13}$ ions/cm$^2$ at implant energies of 20 keV to 300 keV, by way of example. Implanting the deep well n-type dopants 365 in two or more doses may distribute the deep well n-type dopants 365 more evenly in the semiconductor material 302 compared to implanting at a single dose, advantageously reducing a thermal profile of a subsequent anneal process to activate the implanted deep well n-type dopants 365.

After the deep well n-type dopants 365 are implanted, the deep well mask 364 is removed. The deep well mask 364 may be removed by an asher process, followed by a wet clean process using an aqueous mixture of hydrogen peroxide and ammonium hydroxide, or an aqueous mixture of sulfuric acid and hydrogen peroxide.

Figure 3B:
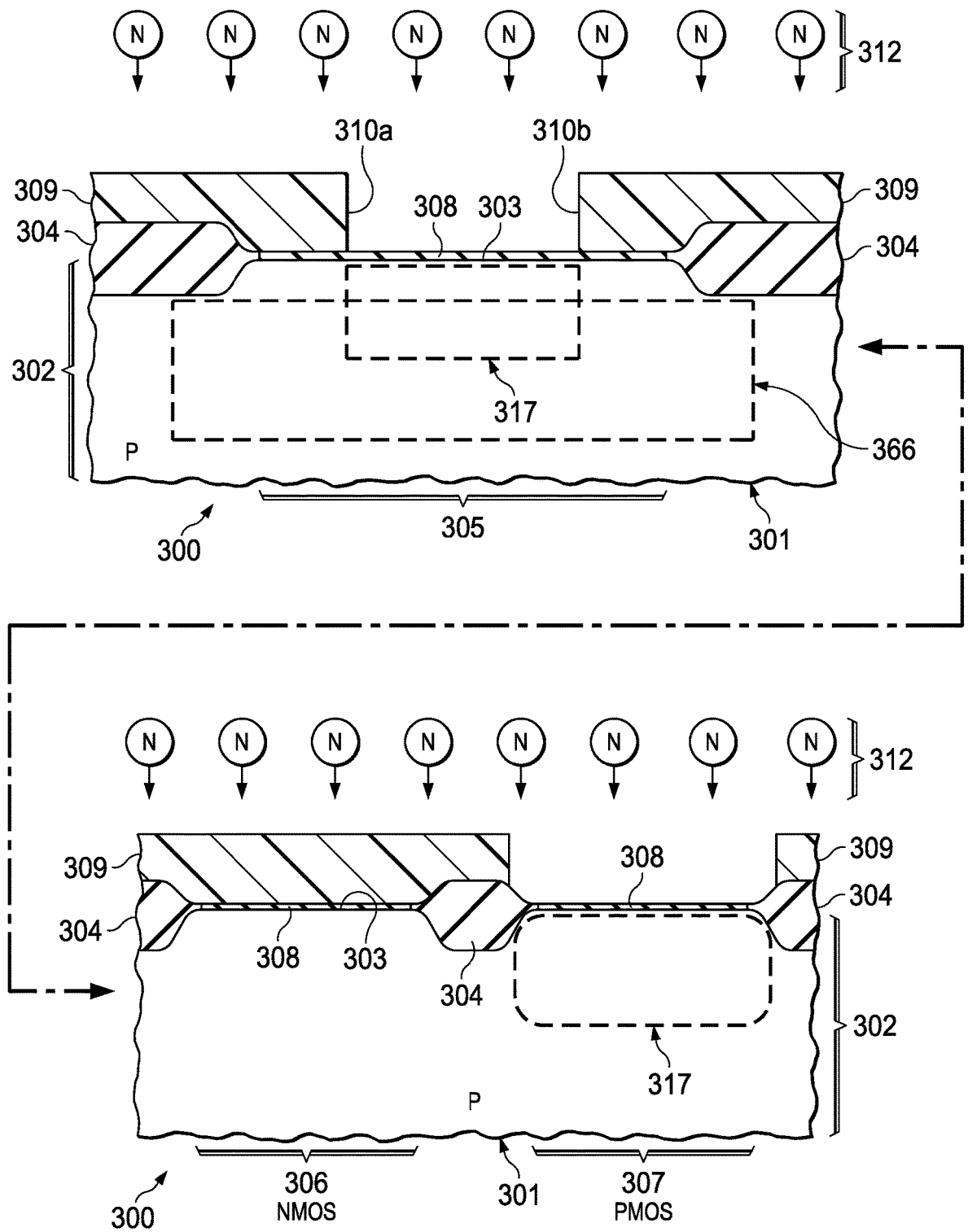

Referring to FIG. 3B, a first well implant mask 309 is formed over the substrate 301, exposing areas in the analog transistor 305 and the PMOS transistor 307, for subsequently formed n-type wells, shown in FIG. 3D. The first well implant mask 309 may have a composition and structure similar to the first well implant mask 109 of FIG. 1A. The first well implant mask 309 has a source-side edge 310a and a drain-side edge 310b on opposite sides of the exposed area in the analog transistor 305.

First n-type dopants 312 are implanted into the semiconductor material 302 where exposed by the first well implant mask 309, form a first implanted region 317. The first n-type dopants 312 may be implanted in multiple doses at different energies, as disclosed in reference to the first n-type dopants 116 of FIG. 1B. A portion of the first n-type dopants 312 in the first implanted region 317 extends in the semiconductor material 302 deeper than the field relief dielectric layer 304.

The first well implant mask 309 is subsequently removed. The first well implant mask 309 may be removed as disclosed for removing the first well implant mask 109 of FIG. 1A.

Figure 3C:
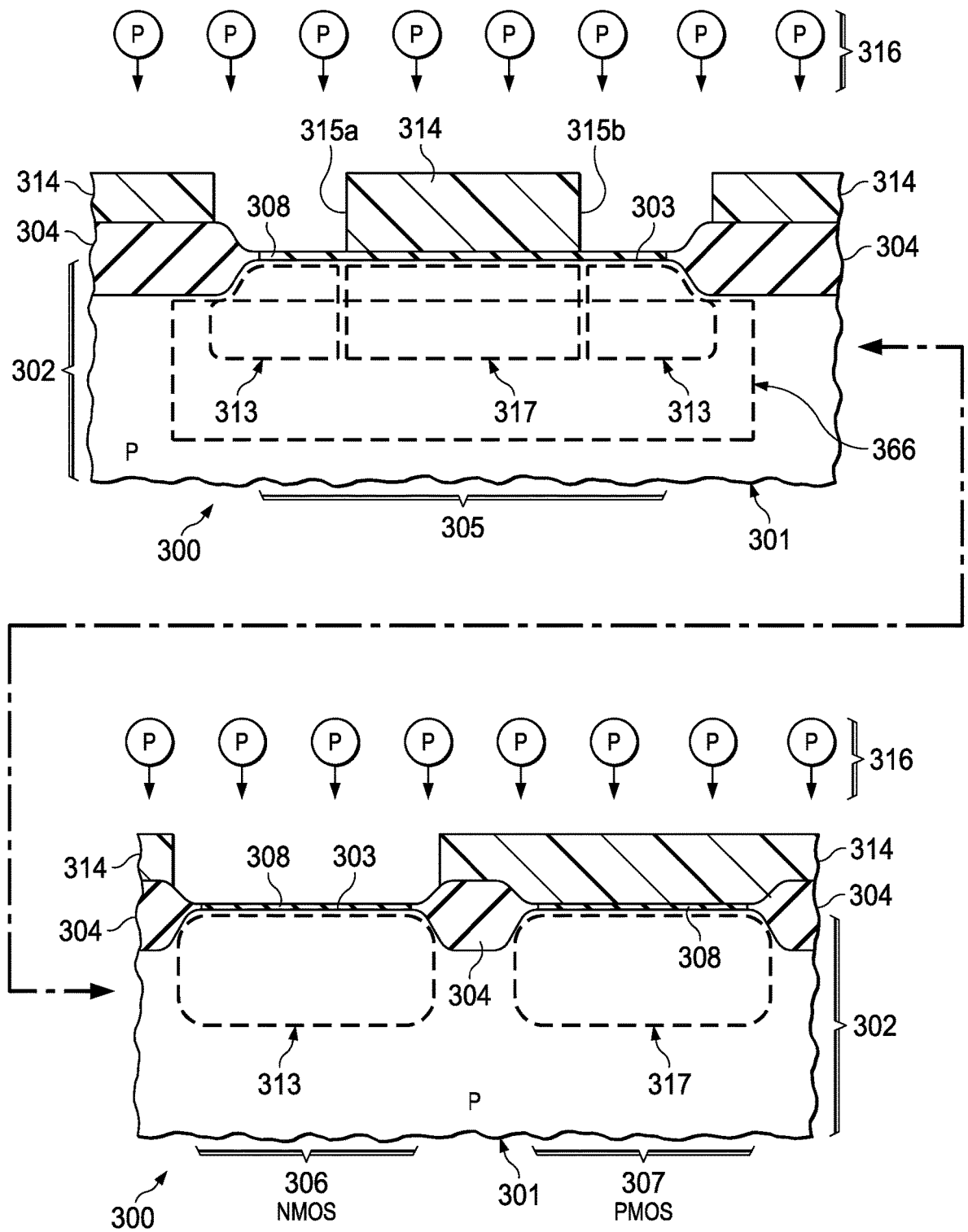

Referring to FIG. 3C, a second well implant mask 314 is formed over the substrate 301, exposing areas in the analog transistor 305 and the PMOS transistor 307, for subsequently formed n-type wells, shown in FIG. 3C. The second well implant mask 314 may have a similar composition and structure to the first well implant mask 309, and may be formed by a similar process. The second well implant mask 314 has a source-side edge 315a of an exposed area for a subsequently-formed source well 321 of the analog transistor 305, shown in FIG. 3D. The source-side edge 315a of the second well implant mask 314 may be coincident with the source-side edge 310a of the first well implant mask 309 of FIG. 3B, within alignment tolerances of photolithographic processes used to form the microelectronic device 300. For example, the source-side edge 315a of the second well implant mask 314 may be coincident with the source-side edge 310a of the first well implant mask 309 within 0.10 microns. The second well implant mask 314 has a drain-side edge 315b of an exposed area for a subsequently-formed drain well 322 of the analog transistor 305, shown in FIG. 3D. In this example, the drain-side edge 315b of the second well implant mask 314 may be coincident with the drain-side edge 310b of the first well implant mask 309 of FIG. 3B, within the alignment tolerances.

First p-type dopants 316 are implanted into the semiconductor material 302 where exposed by the second well implant mask 314, to form a second implanted region 313. The first n-type dopants 316 may be implanted in multiple doses at different energies, as disclosed in reference to the first p-type dopants 112 of FIG. 1A. A portion of the first p-type dopants 316 in the second implanted region 313 extends in the semiconductor material 302 deeper than the field relief dielectric layer 304.

The second well implant mask 314 is subsequently removed. The second well implant mask 314 may be removed by a process similar to the process used to remove the first well implant mask 309. The first protective oxide layer 308 may be removed after the first n-type dopants 312 and the first p-type dopants 316 are implanted.

Figure 3D:
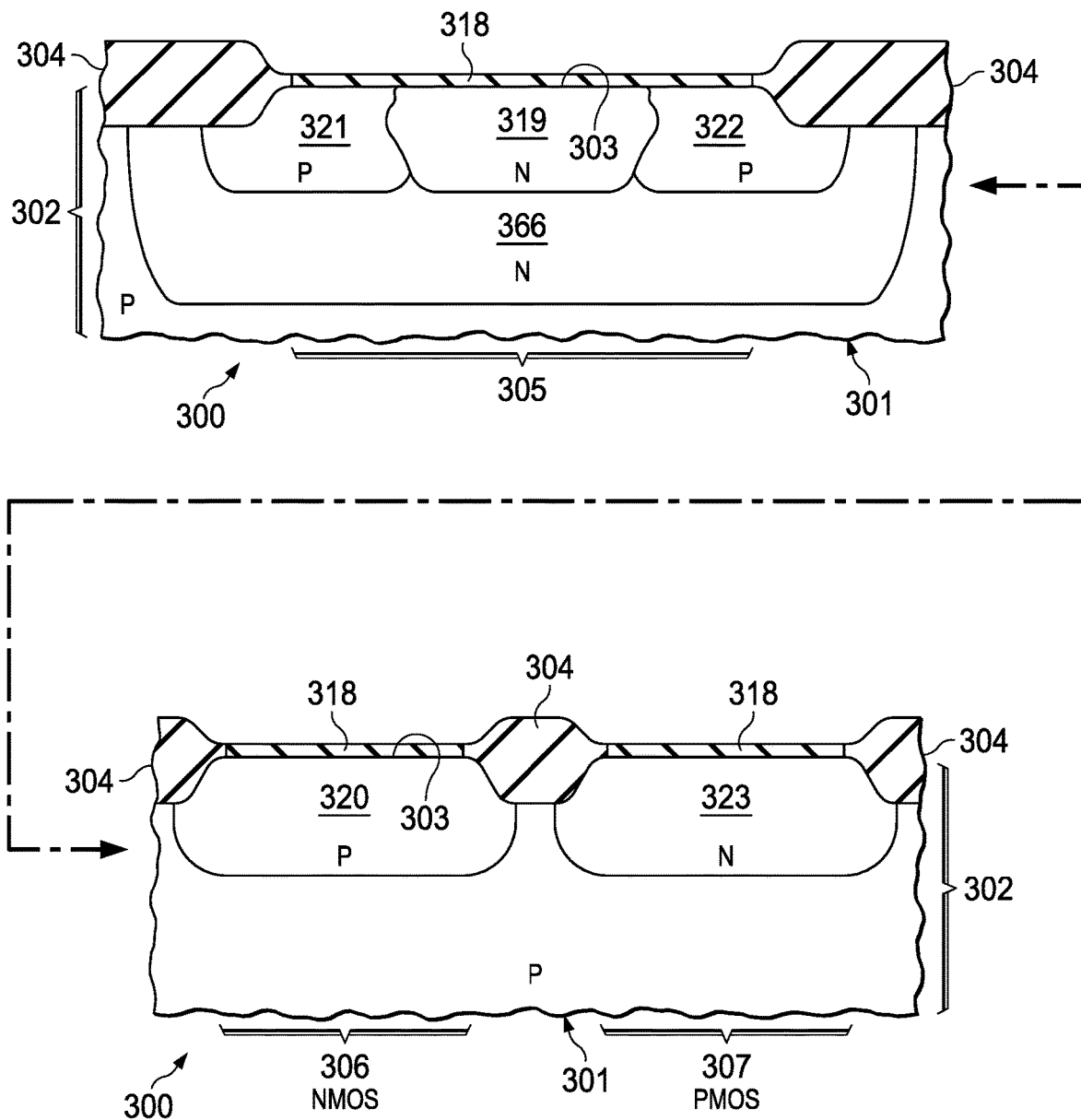

Referring to FIG. 3D, a thick gate dielectric layer 318 is formed on the semiconductor material 302 where exposed at the top surface 303, including in the areas for the analog transistor 305, the NMOS transistor 306, and the PMOS transistor 307. The thick gate dielectric layer 318 may have a composition and thickness similar to the thick gate dielectric layer 118 disclosed in reference to FIG. 1C.

The process of forming the thick gate dielectric layer 318 heats the semiconductor material 302 sufficiently to activate at least a portion of the implanted deep well n-type dopants 365 of FIG. 3A in the deep implanted region 366 of FIG. 3C, the implanted n-type dopants 312 of FIG. 3B in the first implanted region 317 of FIG. 3C, and the implanted p-type dopants 316 of FIG. 3C in the second implanted region 313 of FIG. 3C. The implanted deep well n-type dopants 365 in the deep implanted region 366 form a deep n-type well 367 in the semiconductor material 302 in the area for the analog transistor 305. The implanted n-type dopants 312 in the first implanted region 317 form a body well 319 of the analog transistor 305 and an n-type well 323 under the PMOS transistor 307. The body well 319 and the n-type well 323 are n-type, and have similar distributions of the implanted n-type dopants 312. The implanted p-type dopants 316 in second first implanted region 313 form a source well 321 and a drain well 322 of the analog transistor 305, and a p-type well 320 under the NMOS transistor 306. The source well 321, the drain well 322, and the p-type well 320 are p-type, and have similar distributions of the implanted p-type dopants 316. The body well 319, the source well 321, the drain well 322, the p-type well 320, and the n-type well 323 extend deeper in the semiconductor material 302 than the field relief dielectric layer 304. The deep n-type well 367 extends deeper in the semiconductor material 302 than the body well 319, the source well 321, and the drain well 322. The deep n-type well 367 surrounds the wells 319, 321, and 322, and isolates the wells 319, 321, and 322 from the semiconductor material 302 below and laterally adjacent to the deep n-type well 367.

Figure 3E:
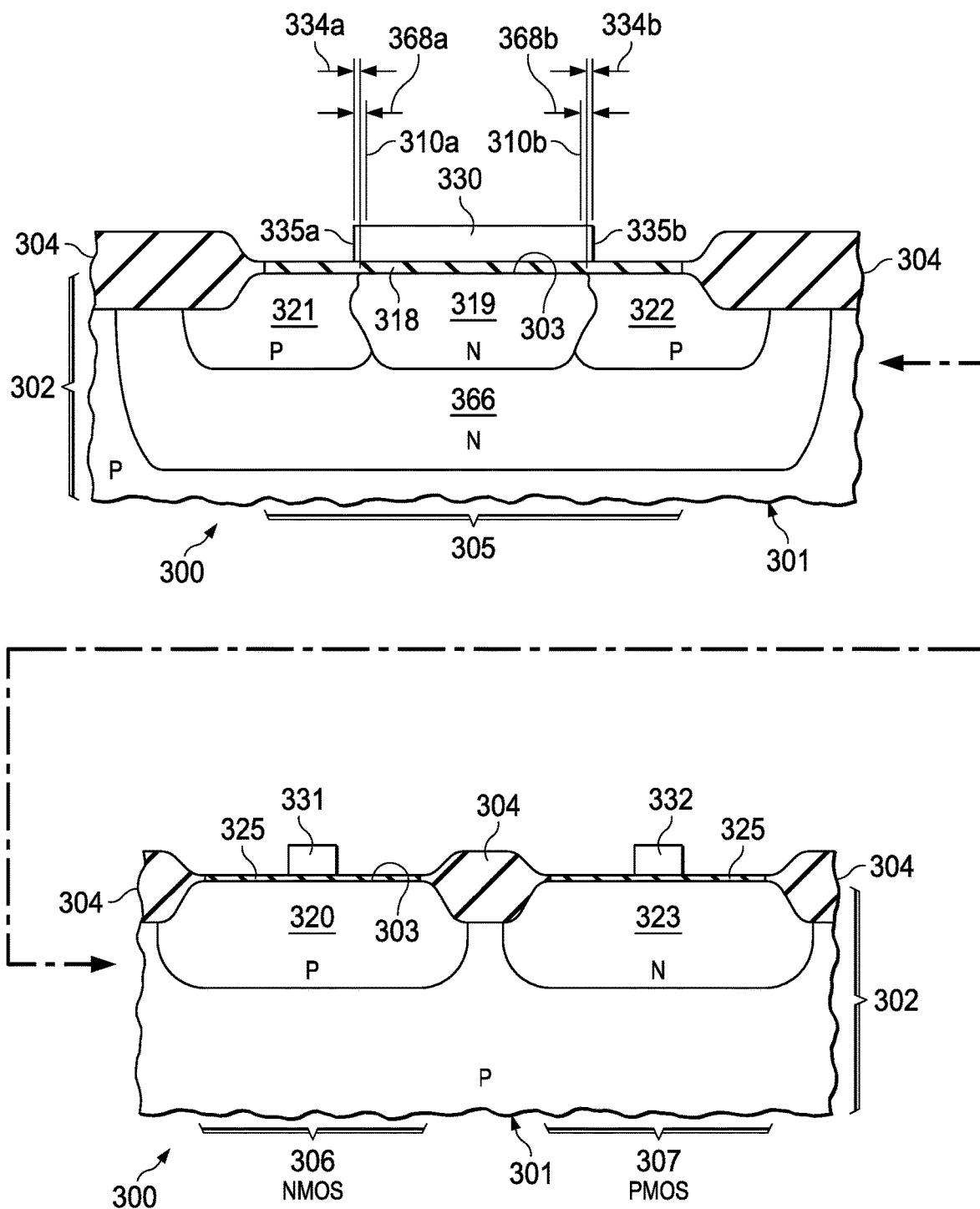

Referring to FIG. 3E, the thick gate dielectric layer 318 is removed over the NMOS transistor 306 and the PMOS transistor 307. A thin gate dielectric layer 325 is formed on the top surface 303 of the semiconductor material 302 in the areas for the NMOS transistor 306 and the PMOS transistor 307. The thin gate dielectric layer 325 may have a composition and thickness similar to the thin gate dielectric layer 125 of FIG. 1E. The process of forming the thin gate dielectric layer 325 heats the semiconductor material 302, which may activate an additional portion of the p-type dopants in the source well 321, the drain well 322, and the p-type well 320, and may activate an additional portion of the n-type dopants in the body well 319, the n-type well 323, and the deep n-type well 367.

A gate electrode 330 of the analog transistor 305 is formed on the thick gate dielectric layer 318 above the body well 319. The gate electrode 330 may be formed as disclosed in reference to FIG. 1F and FIG. 1G for forming the gate electrode 130. The gate electrode 330 has a source-side edge 335a over the source well 321, and has a drain-side edge 335b over the drain well 322. The source-side edge 335a extends past the source-side edge 310a, shown in FIG. 3E for reference, of the first well implant mask 309 of FIG. 3B, by a source-side overlap 368a of 0.16 microns to 0.25 microns. The drain-side edge 335b extends past the drain-side edge 310b, shown in FIG. 3E for reference, of the first well implant mask 309 by a drain-side overlap 368b of 0.16 microns to 0.25 microns. The source-side overlap 368a may be different from the drain-side overlap 368b due to photolithographic alignment issues encountered in forming the gate electrode 330. Having the source-side overlap 368a and the drain-side overlap 368b at 0.16 microns to 0.25 microns may advantageously balance an on-state current and an area of the analog transistor 305 with a noise level and threshold precision of the analog transistor 305. Increasing both the source-side overlap 368a and the drain-side overlap 368b above 0.25 microns may increase a channel length, undesirably reducing the on-state current, and undesirably increasing the area of the analog transistor 305, while not improving the noise level and threshold precision. Reducing both the source-side overlap 368a and the drain-side overlap 368b below 0.16 microns may produce regions having an uncontrolled resistance at ends of a channel of the analog transistor 305, undesirably increasing the noise level and degrading the threshold precision, while not improving the on-state current. The source well 321 may extend partway under the gate electrode 330 at the top surface 303 by a gate-source overlap distance 334a of 20 nanometers to 125 nanometers. The drain well 322 may extend partway under the gate electrode 330 at the top surface 303 by a gate-drain overlap distance 334b of 20 nanometers to 125 nanometers, in this example.

A gate electrode 331 of the NMOS transistor 306 and a gate electrode 332 of the PMOS transistor 307 are formed on the thin gate dielectric layer 325. The gate electrodes 331 and 332 may be formed concurrently with the gate electrode 330 of the analog transistor 305, for example, as disclosed in reference to FIG. 1F and FIG. 1G.

Figure 3F:
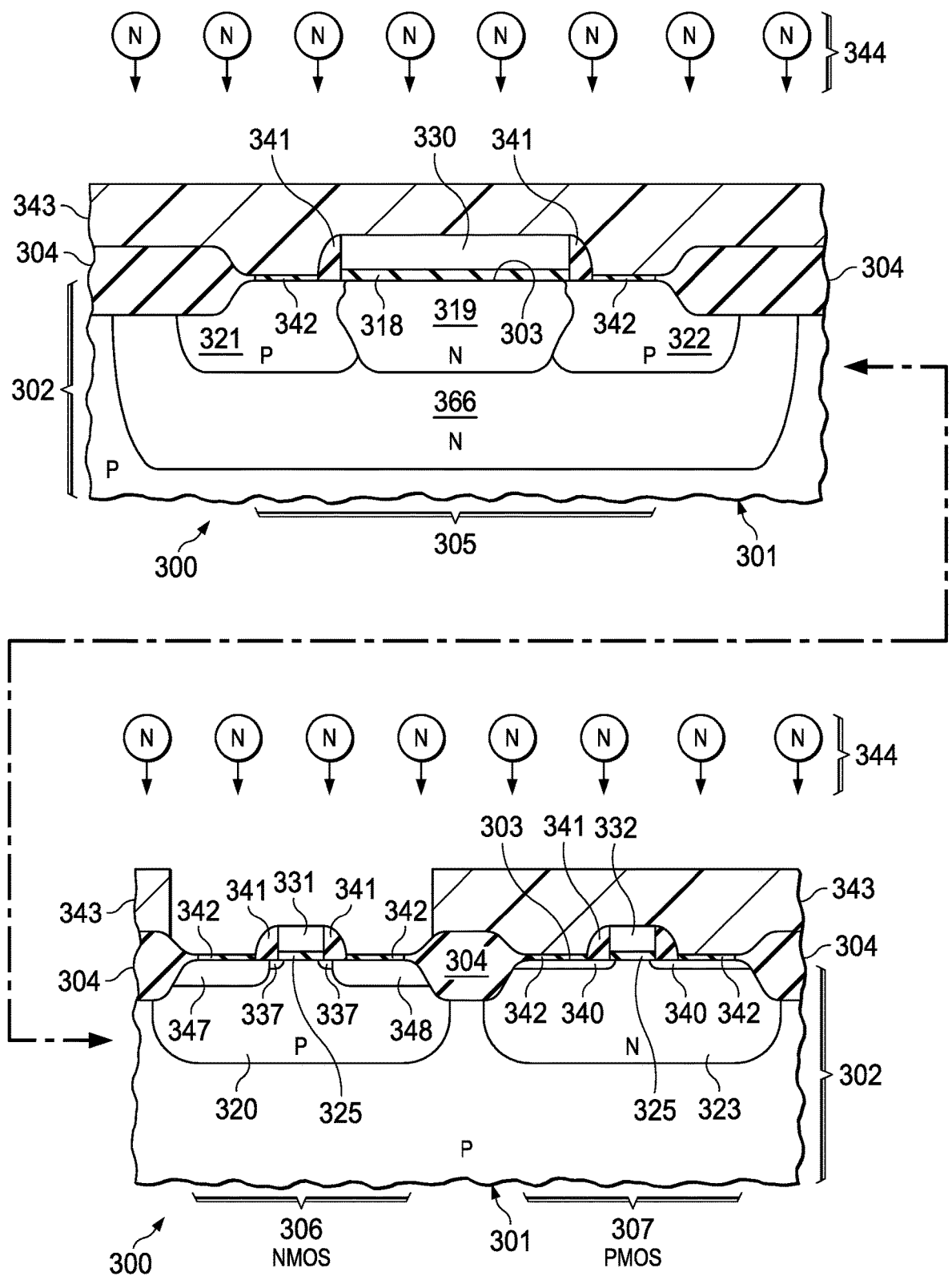

Referring to FIG. 3F. NLDD regions 337 are formed in the semiconductor material 302 adjacent to the gate electrode 331 of the NMOS transistor 306. P-type halo regions, not shown, may be formed in the NMOS transistor 306, concurrently with the NLDD regions 337. The NLDD regions 337 may be formed as disclosed in reference to FIG. 1H. Neither NLDD regions nor p-type halo regions are formed in the analog transistor 305.

PLDD regions 340 are formed in the semiconductor material 302 adjacent to the gate electrode 332 of the PMOS transistor 307. N-type halo regions, not shown, may be formed in the PMOS transistor 307, concurrently with the PLDD regions 340. The PLDD regions 340 may be formed as disclosed in reference to FIG. 1I. Neither PLDD regions nor n-type halo regions are formed in the analog transistor 305.

Sidewall spacers 341 are formed on lateral surfaces of the gate electrodes 330, 331 and 332. The sidewall spacers 341 may have compositions and structures similar to the sidewall spacers 141 of FIG. 1J, and may be formed by a similar method. The thick gate dielectric layer 318 may be partially or completely removed in the analog transistor 305 where exposed by the gate electrode 330 during formation of the sidewall spacers 341, as indicated in FIG. 3E. Similarly, the thin gate dielectric layer 325 may be partially or completely removed in the NMOS transistor 306 and the PMOS transistor 307 where exposed by the gate electrodes 331 and 332. A temporary oxide layer 342 may be formed over the semiconductor material 302 and any remnants of the thick gate dielectric layer 318 and the thin gate dielectric layer 325.

A first source/drain implant mask 343 is formed over the microelectronic device 300, exposing the NMOS transistor 306, and covering the analog transistor 305 and the PMOS transistor 307. The first source/drain implant mask 343 may have a composition and structure similar to the first source/drain implant mask 143 of FIG. 1J, and may be formed by a similar method. Second n-type dopants 344 are implanted into the semiconductor material 302 where exposed by the first source/drain implant mask 343, including the semiconductor material 302 adjacent to the sidewall spacers 341 on the gate electrode 331 of the NMOS transistor 306, and are activated after the first source/drain implant mask 343 is subsequently removed, to form a source contact region 347 and a drain contact region 348 of the NMOS transistor 306 in the p-type well 320. The second n-type dopants 344 are blocked from the semiconductor material 302 directly under the gate electrode 331. After the second n-type dopants 344 are implanted, the first source/drain implant mask 343 is removed, for example as disclosed in reference to removal of the first source/drain implant mask 143 of FIG. 1J.

Figure 3G:
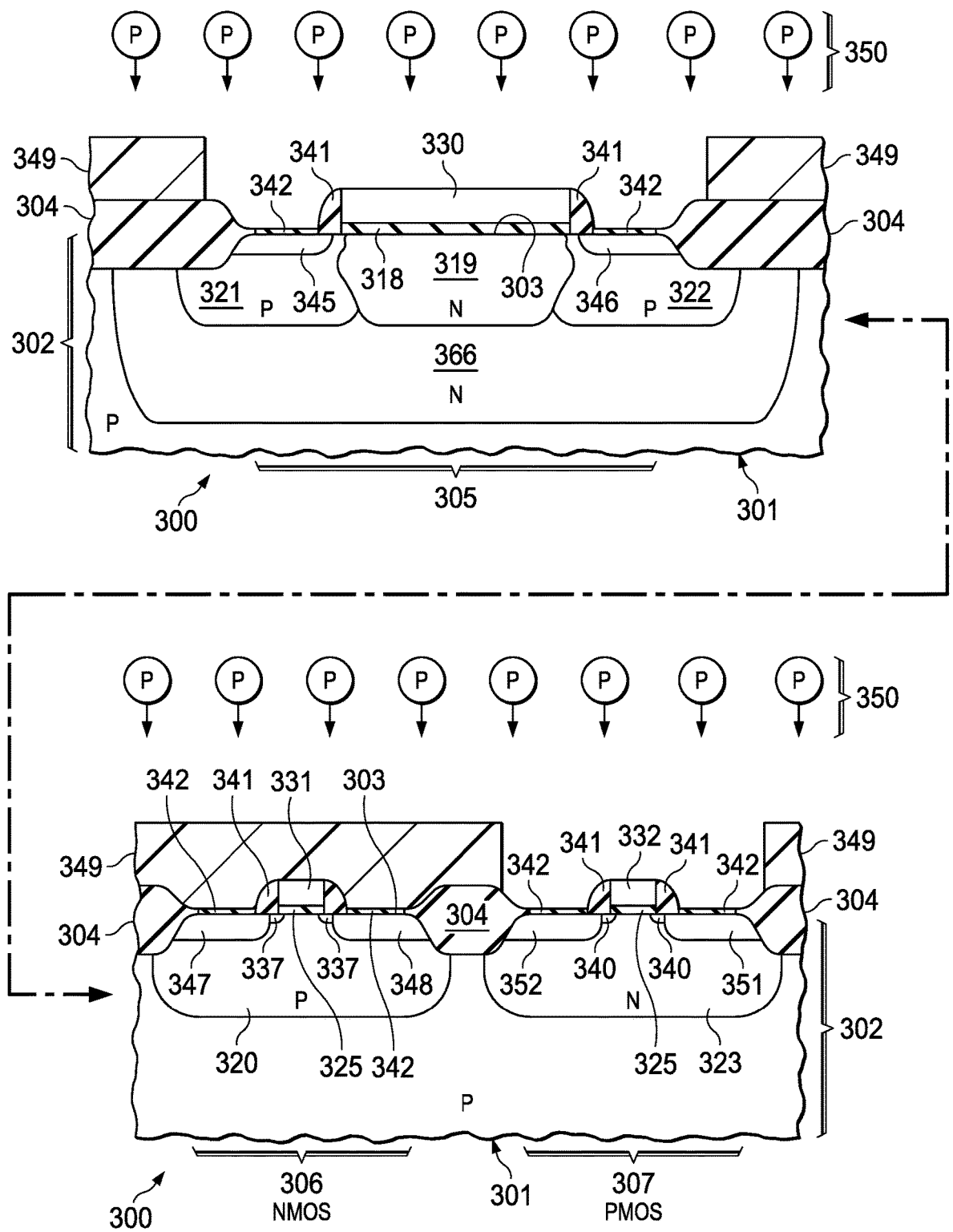

Referring to FIG. 3G, a second source/drain implant mask 349 is formed over the microelectronic device 300, exposing the analog transistor 305 and the PMOS transistor 307, and covering the NMOS transistor 306. The second source/drain implant mask 349 may have a composition and structure similar to the first source/drain implant mask 343. Second p-type dopants 350 are implanted into the semiconductor material 302 where exposed by the second source/drain implant mask 349, including the semiconductor material 302 adjacent to the sidewall spacers 341 on the gate electrodes 330 and 332 of the analog transistor 305 and the PMOS transistor 307, respectively, and are activated after the second source/drain implant mask 349 is subsequently removed, to form a source contact region 345 and a drain contact region 346 of the analog transistor 305 in the source well 321 and the drain well 322, respectively, and to form a source contact region 351 and a drain contact region 352 of the PMOS transistor 307 in the n-type well 323. The second p-type dopants 350 are blocked from the semiconductor material 302 directly under the gate electrodes 330 and 332. After the second p-type dopants 350 are implanted, the second source/drain implant mask 349 is removed, for example as disclosed in reference to removal of the first source/drain implant mask 135 of FIG. 1H. The source contact region 345 and the drain contact region 346 of the analog transistor 305 do not extend under the gate electrode 330 of the analog transistor 305.

Figure 3H:
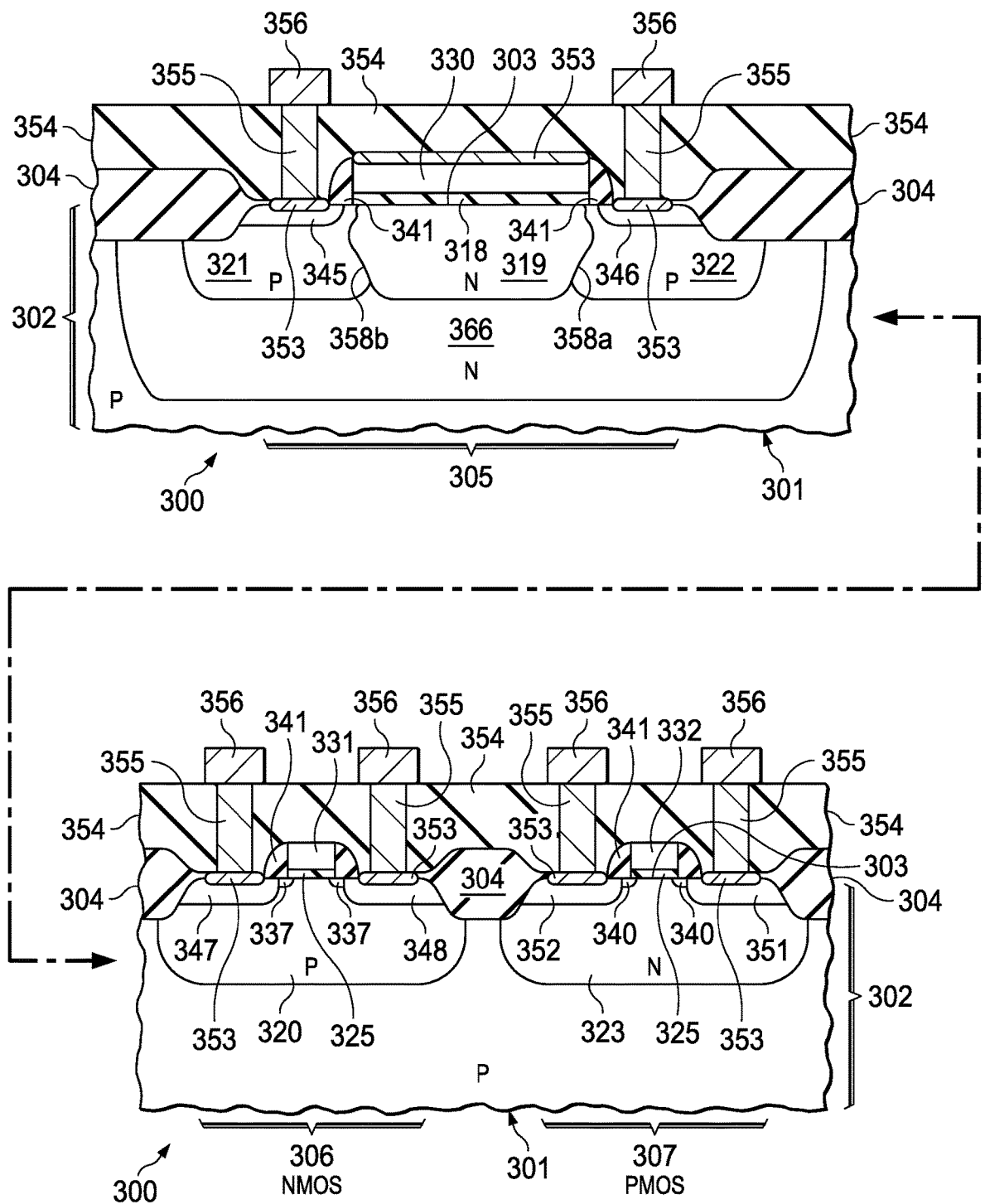

Referring to FIG. 3H, metal silicide 353 of the microelectronic device 300 may be formed on the source contact region 345, the drain contact region 346, and the gate electrode 330 of the analog transistor 305, on the source contact region 347, the drain contact region 348, and the gate electrode 331 of the NMOS transistor 306, and on the source contact region 351, the drain contact region 352, and the gate electrode 332 of the PMOS transistor 307. The metal silicide 353 may be formed as disclosed in reference to FIG. 1L. A PMD layer 354 of the microelectronic device 300 is formed over the substrate 301, the field relief dielectric layer 304, the transistors 305, 306, and 307, and the metal silicide 353. The PMD layer 354 is electrically non-conductive, and may have the composition and structure as disclosed in reference to FIG. 1L. Contacts 355 are formed through the PMD layer 354, making electrical connections to the metal silicide 353. The contacts 355 are electrically conductive, and may be formed as disclosed in reference to FIG. 1L. Interconnects 356 are formed on the PMD layer 354, making electrical connections to the contacts 355. The interconnects 356 are electrically conductive, and may be formed as disclosed in reference to FIG. 1L.

During operation of the microelectronic device 300, the analog transistor 305 of this example may be operated at a drain-source bias of −4 volts to −6 volts, and may attain the advantages of low noise, high threshold precision, and high on-state current disclosed in reference to FIG. 1A through FIG. 1L. A drain-body junction 358a and a source-body junction 358b of the analog transistor 305 may have an undulating profile, as indicated in FIG. 3D, due to the plurality of doses of the first n-type dopants 312 of FIG. 3B and the first p-type dopants 316 of FIG. 3C. The drain-body junction 358a and the source-body junction 358b of this example may have breakdown voltages of 10.5 volts to 11.5 volts, as a consequence of forming the edges 315a and 315b of the second well implant mask 314 of FIG. 3C coincident with the edges 310a and 310b of the first well implant mask 309 of FIG. 3B, as disclosed in reference to FIG. 3C.

Various features of the examples disclosed herein may be combined in other manifestations of example microelectronic devices. For example, the analog transistors 105, 205, and 305 may be n-channel or p-channel, by appropriate changes in polarities of dopants. Any of the analog transistors 105, 205, or 305 may be electrically isolated by a buried layer and an isolation structure, as disclosed in reference to FIG. 2 Any of the analog transistors 105, 205, or 305 may be electrically isolated by a deep well, as disclosed in reference to FIG. 3H. Any of the analog transistors 105, 205, or 305 may have drain wells that extend further under the corresponding gate electrodes 130, 230, or 330 than the source wells, as disclosed in reference to FIG. 2. Any of the microelectronic devices 100, 200, or 300 may have field relief dielectric layers with STI structures or with LOCOS structures.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a substrate containing a semiconductor material;
   a field relief dielectric layer on a top surface of the semiconductor material; and
   a metal oxide semiconductor (MOS) transistor, including:
      a body well in the semiconductor material, the body well having a first conductivity type;
      a drain well in the semiconductor material, laterally contacting the body well, the drain well having a second conductivity type opposite the first conductivity type;
      a source well in the semiconductor material, laterally contacting the body well opposite from the drain well, the source well having the second conductivity type, wherein the source well has a first portion overlapping a footprint of the body well and a second portion nonoverlapping the footprint; and
      a gate electrode on a gate dielectric layer disposed on the top surface, wherein the drain well extends partway under the gate electrode at the top surface, and the source well extends partway under the gate electrode at the top surface.

2. The microelectronic device of claim 1, wherein the MOS transistor further includes a drain contact region in the drain well and a source contact region in the source well, wherein:
   the drain contact region and the source contact region have the second conductivity type;
   the drain contact region and the source contact region have average dopant concentrations higher than the source well and the drain well;
   the drain contact region does not extend under the gate electrode; and
   the source contact region does not extend under the gate electrode.

3. The microelectronic device of claim 1, wherein the source well extends under the gate electrode at the top surface by a gate-source overlap distance of 20 nanometers to 125 nanometers, and the drain well extends under the gate electrode at the top surface by a gate-drain overlap distance of 20 nanometers to 125 nanometers.

4. The microelectronic device of claim 1, wherein the drain well extends under the gate electrode at the top surface by a gate-drain overlap distance greater than 125 nanometers.

5. The microelectronic device of claim 1, further including a first MOS transistor and a second transistor, wherein:
   the first MOS transistor is formed over a first well having a similar dopant distribution as the body well;
   the second MOS transistor is formed over a second well having a similar dopant distribution as the source well; and
   the first MOS transistor and the second MOS transistor have first gate dielectric layers thinner than a gate dielectric layer of the MOS transistor.

6. The microelectronic device of claim 1, further including a buried layer under the body well, the source well, and the drain well, the buried layer having the second conductivity type.

7. The microelectronic device of claim 1, further including a deep well under the body well, the source well, and the drain well, the deep well having the first conductivity type.

8. The microelectronic device of claim 1, wherein the body well does not extend completely under the source well, and the body well does not extend completely under the drain well.

9. A microelectronic device, comprising:
a substrate;
a field relief dielectric layer on the substrate; and
a metal oxide semiconductor (MOS) transistor, including:
- a body well extending deeper in the substrate than the field relief dielectric layer;
- a drain well contacting the body well, the drain well extending deeper in the substrate than the field relief dielectric layer;
- a source well contacting the body well opposite from the drain well, the source well extending deeper in the substrate than the field relief dielectric layer, wherein the source well has a first portion overlapping a footprint of the body well and a second portion nonoverlapping the footprint;
- a gate dielectric layer on the body well; and
- a gate electrode on the gate dielectric layer, wherein the drain well extends partway under the gate electrode, and the source well extends partway under the gate electrode.

10. The microelectronic device of claim 9, wherein the MOS transistor further includes a drain contact region in the drain well and a source contact region in the source well, wherein:
the drain contact region has a same conductivity type as the drain well and the source contact region has a same conductivity type as the source well;
the drain contact region and the source contact region have average dopant concentrations higher than the source well and the drain well;
the drain contact region does not extend under the gate electrode; and
the source contact region does not extend under the gate electrode.

11. The microelectronic device of claim 9, wherein the source well extends under the gate electrode by a gate-source overlap distance, and the drain well extends under the gate electrode by a gate-drain overlap distance different than the gate-source overlap distance.

12. The microelectronic device of claim 9, further including a first MOS transistor and a second MOS transistor, wherein:
the first MOS transistor is formed over a first well having a similar dopant distribution as the body well;
the second MOS transistor is formed over a first well having a similar dopant distribution as the source well; and
the first MOS transistor and the second MOS transistor have gate dielectric layers thinner than the gate dielectric layer of the MOS transistor.

13. The microelectronic device of claim 1, wherein:
the body well extends deeper in the substrate than the field relief dielectric layer;
the drain well extends deeper in the substrate than the field relief dielectric layer; and
the source well extends deeper in the substrate than the field relief dielectric layer.

14. The microelectronic device of claim 1, wherein:
the body well extends from the top surface to a first depth in the semiconductor material;
the drain well extends from the top surface to a second depth in the semiconductor material, the second depth being substantially same as the first depth; and
the source well extends from the top surface to the second depth.

15. The microelectronic device of claim 1, wherein the drain well includes a first portion overlapping the footprint and a second portion nonoverlapping the footprint.

16. The microelectronic device of claim 1, wherein the gate dielectric layer is thinner than the field relief dielectric layer.

17. The microelectronic device of claim 1, further comprising:
a first pn junction between the body well and the drain well, wherein the first pn junction has a first undulating profile; and
a second pn junction between the body well and the source well, wherein the second pn junction has a second undulating profile.

18. The microelectronic device of claim 17, wherein the first undulating profile and the second undulating profile are symmetrical.

19. The microelectronic device of claim 1, wherein:
the source well extends under the gate electrode at the top surface by a first distance; and
the drain well extends under the gate electrode at the top surface by a second distance.

20. The microelectronic device of claim 19, wherein the first distance is substantially same as the second distance.

21. The microelectronic device of claim 19, wherein the first distance is less than the second distance.

* * * * *